United States Patent
Han et al.

(10) Patent No.: US 11,534,790 B2
(45) Date of Patent: Dec. 27, 2022

(54) APPARATUS AND METHOD OF MANUFACTURING DISPLAY APPARATUS

(71) Applicant: SAMSUNG DISPLAY CO., LTD., Yongin-si (KR)

(72) Inventors: Sangjin Han, Yongin-si (KR); Eugene Kang, Yongin-si (KR); Junha Park, Yongin-si (KR); Mingyu Seo, Yongin-si (KR); Youjong Lee, Yongin-si (KR); Jongbun Han, Yongin-si (KR); Euna Ko, Yongin-si (KR); Sungjong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 107 days.

(21) Appl. No.: 15/806,609

(22) Filed: Nov. 8, 2017

(65) Prior Publication Data

US 2018/0290168 A1     Oct. 11, 2018

(30) Foreign Application Priority Data

Apr. 10, 2017     (KR) .................. 10-2017-0046300

(51) Int. Cl.
   *B05B 15/68*     (2018.01)
   *B05B 13/00*     (2006.01)
   (Continued)

(52) U.S. Cl.
   CPC .............. *B05B 15/68* (2018.02); *B05B 13/00* (2013.01); *B05D 1/02* (2013.01); *C23C 14/042* (2013.01);
   (Continued)

(58) Field of Classification Search
   CPC ....................................................... B05D 1/02
   See application file for complete search history.

(56) References Cited

U.S. PATENT DOCUMENTS 4,529,885 A * 7/1985 Waite ................ H05B 33/22
                                                    313/509
4,919,967 A * 4/1990 Handke ............. B05B 13/0452
                                                    427/8
(Continued)

FOREIGN PATENT DOCUMENTS

CN          1458811 A     11/2003
CN        101845612 A      9/2010
(Continued)

OTHER PUBLICATIONS

Chinese Office action issued in corresponding application No. CN 201810315462.0, dated Jun. 15, 2021, 10 pages.
(Continued)

*Primary Examiner* — Robert A Vetere
(74) *Attorney, Agent, or Firm* — Lewis Roca Rothgerber Christie LLP

(57) ABSTRACT

An apparatus for manufacturing a display apparatus includes a deposition source, a nozzle head, a substrate fixer, and a deposition preventer. The deposition source is outside the chamber and vaporizes or sublimates a deposition material. The nozzle head is in the chamber, is connected to the at least one deposition source, and simultaneously sprays the deposition material onto an entire surface of a display substrate. The substrate fixer is connected to the chamber and moves linearly, with the display apparatus is mounted on the substrate fixer. The deposition preventer is in the chamber surrounding an edge portion of the nozzle head and an edge portion of the substrate fixer. The deposition preventer is heated during a deposition process.

15 Claims, 9 Drawing Sheets

(51) Int. Cl.

| | | |
|---|---|---|
| B05D 1/02 | (2006.01) | |
| C23C 16/458 | (2006.01) | |
| C23C 16/455 | (2006.01) | |
| C23C 14/24 | (2006.01) | |
| C23C 14/54 | (2006.01) | |
| C23C 14/50 | (2006.01) | |
| C23C 16/448 | (2006.01) | |
| C23C 14/04 | (2006.01) | |
| C23C 14/12 | (2006.01) | |
| C23C 16/44 | (2006.01) | |
| C23C 16/46 | (2006.01) | |
| H01L 51/00 | (2006.01) | |

(52) U.S. Cl.
CPC ............ *C23C 14/12* (2013.01); *C23C 14/243* (2013.01); *C23C 14/246* (2013.01); *C23C 14/505* (2013.01); *C23C 14/541* (2013.01); *C23C 14/542* (2013.01); *C23C 16/4401* (2013.01); *C23C 16/4485* (2013.01); *C23C 16/4486* (2013.01); *C23C 16/4557* (2013.01); *C23C 16/4584* (2013.01); *C23C 16/45512* (2013.01); *C23C 16/45517* (2013.01); *C23C 16/45521* (2013.01); *C23C 16/45565* (2013.01); *C23C 16/45574* (2013.01); *C23C 16/45591* (2013.01); *C23C 16/46* (2013.01); *H01L 51/001* (2013.01)

(56) References Cited

U.S. PATENT DOCUMENTS

| | | | |
|---|---|---|---|
| 6,309,465 | B1 | 10/2001 | Jürgensen et al. |
| 6,337,102 | B1 | 1/2002 | Forrest et al. |
| 6,960,262 | B2 | 11/2005 | Sasaki et al. |
| 7,473,316 | B1 | 1/2009 | Schottker et al. |
| 8,512,022 | B2 | 8/2013 | Back |
| 8,685,500 | B2 | 4/2014 | Gersdorff |
| 8,846,442 | B2 | 9/2014 | Probst |
| 8,932,682 | B2 | 1/2015 | Arai |
| 9,502,693 | B2 | 11/2016 | Park et al. |
| 9,593,409 | B2 | 3/2017 | Kimura et al. |
| 2002/0125819 | A1 | 9/2002 | Mishima |
| 2002/0155230 | A1 | 10/2002 | Forrest et al. |
| 2003/0054099 | A1* | 3/2003 | Jurgensen ............ C23C 16/006 427/248.1 |
| 2003/0054586 | A1 | 3/2003 | Shtein et al. |
| 2003/0056720 | A1 | 3/2003 | Dauelsberg et al. |
| 2003/0087471 | A1 | 5/2003 | Shtein et al. |
| 2003/0111015 | A1 | 6/2003 | Franken et al. |
| 2003/0180460 | A1 | 9/2003 | Strauch et al. |
| 2003/0192471 | A1 | 10/2003 | Jurgensen et al. |
| 2003/0221624 | A1 | 12/2003 | Jurgensen et al. |
| 2003/0233768 | A1 | 12/2003 | Kaeppeler |
| 2004/0003779 | A1 | 1/2004 | Jurgensen et al. |
| 2004/0007187 | A1 | 1/2004 | Kappeler et al. |
| 2004/0031442 | A1* | 2/2004 | Yamazaki ............ C23C 14/042 118/727 |
| 2004/0032206 | A1 | 2/2004 | Weaver et al. |
| 2004/0095064 | A1 | 5/2004 | Lu |
| 2004/0129215 | A1 | 7/2004 | Kaeppeler et al. |
| 2004/0191952 | A1 | 9/2004 | Shtein et al. |
| 2004/0200412 | A1 | 10/2004 | Frijlink |
| 2005/0011435 | A1 | 1/2005 | Dauelsberg |
| 2005/0022725 | A1 | 2/2005 | Jurgensen et al. |
| 2005/0026392 | A1 | 2/2005 | Jurgensen et al. |
| 2005/0026402 | A1 | 2/2005 | Jurgensen |
| 2005/0079279 | A1 | 4/2005 | Gu et al. |
| 2005/0087131 | A1 | 4/2005 | Shtein et al. |
| 2005/0106319 | A1 | 5/2005 | Jurgensen et al. |
| 2005/0132954 | A1 | 6/2005 | Kaeppeler |
| 2005/0227390 | A1 | 10/2005 | Shtein et al. |
| 2005/0227406 | A1 | 10/2005 | Shtein et al. |
| 2006/0112881 | A1 | 6/2006 | Kaeppeler |
| 2006/0121309 | A1 | 6/2006 | D'Andrade |
| 2006/0153986 | A1 | 7/2006 | Yamamoto |
| 2006/0249081 | A1 | 11/2006 | Schumacher et al. |
| 2006/0272578 | A1 | 12/2006 | Mullins et al. |
| 2006/0274474 | A1 | 12/2006 | Lee et al. |
| 2007/0029906 | A1 | 2/2007 | Hack et al. |
| 2007/0098891 | A1 | 5/2007 | Tyan et al. |
| 2007/0104890 | A1 | 5/2007 | Boroson et al. |
| 2007/0108890 | A1 | 5/2007 | Forrest |
| 2007/0169702 | A1 | 7/2007 | Khin Teo et al. |
| 2007/0293055 | A1 | 12/2007 | Baumann et al. |
| 2008/0014057 | A1 | 1/2008 | Juergensen et al. |
| 2008/0038583 | A1 | 2/2008 | Itai et al. |
| 2008/0069953 | A1 | 3/2008 | Dauelsberg |
| 2008/0092817 | A1 | 4/2008 | Kappeler et al. |
| 2008/0131601 | A1 | 6/2008 | Kim et al. |
| 2008/0152806 | A1 | 6/2008 | Forrest et al. |
| 2008/0216163 | A1 | 9/2008 | Pratte et al. |
| 2008/0233287 | A1 | 9/2008 | Shtein et al. |
| 2008/0241587 | A1 | 10/2008 | Ohmi et al. |
| 2008/0299311 | A1 | 12/2008 | Shtein et al. |
| 2008/0308040 | A1 | 12/2008 | Dauelsberg |
| 2008/0311296 | A1 | 12/2008 | Shtein et al. |
| 2009/0004830 | A1 | 1/2009 | Kalisch |
| 2009/0013930 | A1 | 1/2009 | Reinhold et al. |
| 2009/0025639 | A1 | 1/2009 | Reinhold et al. |
| 2009/0064935 | A1 | 3/2009 | Dauelsberg |
| 2009/0081853 | A1 | 3/2009 | Schumacher et al. |
| 2010/0090241 | A1 | 4/2010 | D'Andrade et al. |
| 2010/0116791 | A1 | 5/2010 | Teo et al. |
| 2010/0159132 | A1 | 6/2010 | Conroy et al. |
| 2010/0170435 | A1 | 7/2010 | Franken et al. |
| 2010/0186666 | A1 | 7/2010 | Kappeler et al. |
| 2010/0200883 | A1 | 8/2010 | Sato |
| 2011/0045196 | A1 | 2/2011 | Forrest et al. |
| 2011/0057222 | A1 | 3/2011 | Hosoda et al. |
| 2011/0059259 | A1 | 3/2011 | Burrows et al. |
| 2011/0062462 | A1 | 3/2011 | Burrows et al. |
| 2011/0081504 | A1 | 4/2011 | Gersdorff |
| 2011/0097495 | A1 | 4/2011 | Burrows et al. |
| 2011/0114921 | A1 | 5/2011 | Yang et al. |
| 2011/0174217 | A1 | 7/2011 | Gersdorff et al. |
| 2011/0233457 | A1 | 9/2011 | Hyuga |
| 2011/0294283 | A1 | 12/2011 | Brien et al. |
| 2012/0094474 | A1 | 4/2012 | Strauch |
| 2012/0149212 | A1 | 6/2012 | Strauch |
| 2012/0204796 | A1 | 8/2012 | Ruda Y Witt et al. |
| 2012/0286648 | A1 | 11/2012 | Pang et al. |
| 2012/0286650 | A1 | 11/2012 | Pang et al. |
| 2013/0005057 | A1* | 1/2013 | Kim .................... C23C 16/4412 438/26 |
| 2013/0189808 | A1 | 7/2013 | Hack et al. |
| 2013/0217158 | A1 | 8/2013 | Lee |
| 2013/0260488 | A1* | 10/2013 | Kim ................. C23C 16/45508 438/26 |
| 2013/0273239 | A1 | 10/2013 | Harikrishna Mohan et al. |
| 2013/0295337 | A1* | 11/2013 | Busman ................ G02F 1/1303 428/174 |
| 2013/0334511 | A1 | 12/2013 | Savas et al. |
| 2013/0337173 | A1 | 12/2013 | Forrest et al. |
| 2014/0004641 | A1 | 1/2014 | Sonoda et al. |
| 2014/0024180 | A1 | 1/2014 | Choi et al. |
| 2014/0030434 | A1 | 1/2014 | Strzyzewski et al. |
| 2014/0049923 | A1 | 2/2014 | Ma et al. |
| 2014/0057390 | A1 | 2/2014 | Mohan et al. |
| 2014/0065750 | A1 | 3/2014 | Harikrishna Mohan et al. |
| 2014/0212601 | A1 | 7/2014 | Savas et al. |
| 2014/0220262 | A1 | 8/2014 | Savas et al. |
| 2014/0231244 | A1 | 8/2014 | Sasai |
| 2014/0231550 | A1 | 8/2014 | Krücken et al. |
| 2014/0287142 | A1 | 9/2014 | Boyd et al. |
| 2014/0295615 | A1 | 10/2014 | Mohan et al. |
| 2014/0314965 | A1 | 10/2014 | Savas et al. |
| 2015/0007771 | A1 | 1/2015 | Silva et al. |
| 2015/0050806 | A1 | 2/2015 | Park et al. |
| 2015/0111330 | A1 | 4/2015 | Harikrishna Mohan et al. |
| 2015/0140234 | A1 | 5/2015 | Blackburn et al. |
| 2015/0140832 | A1 | 5/2015 | Quinn et al. |
| 2015/0155157 | A1 | 6/2015 | Song et al. |

(56) References Cited

U.S. PATENT DOCUMENTS

| | | |
|---|---|---|
| 2015/0179987 A1 | 6/2015 | Ma et al. |
| 2015/0270109 A1 | 9/2015 | Savas et al. |
| 2015/0284847 A1* | 10/2015 | Hong ................ H01L 21/02532 |
| | | 438/478 |
| 2015/0292083 A1 | 10/2015 | Franken et al. |
| 2015/0303091 A1 | 10/2015 | Ruda Y Witt et al. |
| 2015/0322566 A1 | 11/2015 | Goeres et al. |
| 2015/0380648 A1 | 12/2015 | McGraw et al. |
| 2016/0007410 A1 | 1/2016 | Long et al. |
| 2016/0013412 A1 | 1/2016 | Harikrishna Mohan et al. |
| 2016/0068961 A1 | 3/2016 | Liu et al. |
| 2016/0076145 A1 | 3/2016 | Eickelkamp et al. |
| 2016/0079104 A1 | 3/2016 | Freundt et al. |
| 2016/0104870 A1 | 4/2016 | Harikrishna Mohan et al. |
| 2016/0118450 A1 | 4/2016 | Lee et al. |
| 2016/0118621 A1 | 4/2016 | Harikrishna Mohan et al. |
| 2016/0204008 A1 | 7/2016 | Brien |
| 2016/0225608 A1 | 8/2016 | Kelman et al. |
| 2016/0225619 A1 | 8/2016 | Ruda Y Witt et al. |
| 2016/0230278 A1* | 8/2016 | Gleissner .......... C23C 16/45565 |
| 2016/0247863 A1 | 8/2016 | Choung et al. |
| 2016/0248039 A1 | 8/2016 | Choung et al. |
| 2016/0289837 A1 | 10/2016 | Savas et al. |
| 2016/0315260 A1 | 10/2016 | Harikrishna Mohan et al. |
| 2017/0149020 A1 | 5/2017 | Kim |

FOREIGN PATENT DOCUMENTS

| | | |
|---|---|---|
| CN | 102308174 A | 1/2012 |
| CN | 103140601 A | 6/2013 |
| CN | 103329249 A | 9/2013 |
| CN | 103430625 A | 12/2013 |
| CN | 103958726 A | 7/2014 |
| CN | 104131257 A | 11/2014 |
| CN | 104328377 A | 2/2015 |
| DE | 10 2011 051263 A1 | 12/2012 |
| DE | 10 2015 101461 A1 | 8/2016 |
| EP | 2 626 442 A1 | 8/2013 |
| JP | 2004-022401 A | 1/2004 |
| JP | 2004-131832 A | 4/2004 |
| JP | 2011-225940 A | 11/2011 |
| JP | 5520678 B2 | 4/2014 |
| KR | 10-0348893 B1 | 8/2002 |
| KR | 10-2002-0089350 A | 11/2002 |
| KR | 10-2003-0089643 A | 11/2003 |
| KR | 10-2005-0010746 A | 1/2005 |
| KR | 10-2006-0121103 | 11/2006 |
| KR | 10-2007-0000500 A | 1/2007 |
| KR | 10-2007-0041387 A | 4/2007 |
| KR | 10-2009-0015378 A | 2/2009 |
| KR | 10-2011-0039437 A | 4/2011 |
| KR | 10-2011-0097908 A | 8/2011 |
| KR | 10-2012-0101425 A | 9/2012 |
| KR | 10-1329016 B1 | 12/2013 |
| KR | 10-2016-0047673 A | 5/2016 |
| KR | 10-2016-0084907 A | 7/2016 |
| KR | 10-2016-0103593 A | 9/2016 |
| KR | 10-2016-0103594 A | 9/2016 |
| KR | 10-2016-0116241 A | 10/2016 |
| WO | WO 2011-071064 A1 | 6/2011 |

OTHER PUBLICATIONS

European Examination Report for Application No. 18165246.2, dated Nov. 5, 2021, 6 pages.

\* cited by examiner

APPARATUS AND METHOD OF MANUFACTURING DISPLAY APPARATUS

CROSS-REFERENCE TO RELATED APPLICATION

Korean Patent Application No. 10-2017-00 46300, filed on Apr. 10, 2017, and entitled, "Apparatus and Method of Manufacturing Display Apparatus," is incorporated by reference herein in its entirety.

BACKGROUND

1. Field

One or more embodiments described herein relate to an apparatus and a method for manufacturing a display apparatus.

2. Description of the Related Art

A variety of mobile electronic devices have been developed. Examples include mobile phones and tablet personal computers. These devices include a displays, along with various components for driving the displays. Recently, a display has been designed to bend from a flat orientation to a predetermined angle.

SUMMARY

In accordance with one or more embodiments, an apparatus for manufacturing a display apparatus includes a chamber; at least one deposition source, outside the chamber, to vaporize or sublimate a deposition material; a nozzle head in the chamber and connected to the at least one deposition source, the nozzle head to simultaneously spray the deposition material onto an entire surface of a display substrate; a substrate fixer connected to the chamber and to move linearly, the display apparatus mounted on the substrate fixer; and a deposition preventer in the chamber surrounding an edge portion of the nozzle head and an edge portion of the substrate fixer, the deposition preventer to be heated during a deposition process.

The at least one deposition source may include deposition source chamber and at least one crucible in the deposition source chamber. The at least one crucible may include a plurality of crucibles. The crucibles may be stacked. The at least one deposition source may include a plurality of source heaters respectively arranged on and to separately heat the crucibles. The at least one deposition source may include a connection pipe connecting the deposition source chamber with the nozzle head; and a valve, in the connection pipe, to adjust a degree of opening of the connection pipe.

The at least one deposition source may include a fixed-quantity-material supply to supply a predetermined fixed quantity of a deposition material supplied from an external source; an aerosol generator connected to the fixed-quantity-material supply, the aerosol generator to scatter the predetermined fixed quantity of the deposition material supplied from the fixed-quantity-material supply; and a rapid vaporizer to vaporize or sublimate the deposition material supplied from the aerosol generator. The at least one deposition source may include a connection pipe connecting the rapid vaporizer with the nozzle head; and a valve, in the connection pipe, to adjust a degree of opening of the connection pipe.

The nozzle head may include a supply pipe connected to the at least one deposition source; and a nozzle head body connected to the supply pipe and including a space therein and a plurality of discharge holes. The nozzle head may include a baffle, in the nozzle head body, to scatter a flow path of the deposition material. The nozzle head may include a head operator between the supply pipe and the nozzle head body, wherein the head operator is to move the nozzle head body. The nozzle head may include at least one head heater in the nozzle head body.

The at least one head heater may include a plurality of head heaters, and the head heaters may operate separately. The at least one deposition source may include a plurality of deposition sources, and the nozzle head may include a mixer, connected to the deposition sources, to mix deposition materials supplied from the deposition sources.

The nozzle head body may include a first nozzle head body connected to the supply pipe; a protrusion surface in the first nozzle head body and forming a first space with the first nozzle head body, the protrusion surface to guide a deposition material in the first space into the chamber; and a second nozzle head body spaced from a bottom surface of the protrusion surface and forming a second space with the protrusion surface, the second nozzle head body to guide a deposition material in the second space into the chamber. The supply pipe may include a first supply pipe connected to the first space; and a second supply pipe separate from the first supply pipe and connected to the second space.

The substrate fixer may include a mounting plate on which the display substrate is mounted: and a connector connected to the mounting plate which is to rotate. The substrate fixer may include a mounting plate operator between the mounting plate and the connector, and the mounting plate operator is to move the mounting plate. The substrate fixer may include at least one temperature adjuster, in the mounting plate, to adjust a temperature of the mounting plate. The at least one temperature adjuster may include a plurality of temperature adjusters to operate separately.

The apparatus may include a chamber pressure adjuster, connected to the deposition preventer, to adjust a pressure in the chamber. The apparatus may include a blocking gas supply to spray a blocking gas toward the edge portion of the nozzle head, from the nozzle head toward the substrate fixer. The apparatus may include a material supply to supply deposition material to the at least one deposition source. The material supply may include a rotator to move a crucible while rotating; a material supply area, on a rotation path of the rotator, to supply the deposition material to the crucible; and a cooler, on the rotation path of the rotator, to cool the crucible.

The material supply may include a storage chamber; a deposition material storage area, in the storage chamber, to receive a deposition material introduced from an external source; a fixed-quantity supply, connected to the deposition material storage area, to rotate the deposition material storage area; and a pressure adjuster, connected to the storage chamber, to adjust a pressure in the storage chamber. The material supply may include a particulate material supply to supply a predetermined fixed quantity of the deposition material supplied from the deposition material storage area.

In accordance with one or more other embodiments, a method of manufacturing a display apparatus includes introducing a display substrate into a chamber; spraying and depositing a deposition material onto an entire surface of the display substrate; and maintaining a temperature of the display substrate to be lower than a temperature of the deposition material. The method may include adjusting a degree of parallelization of a nozzle head via which the deposition material is sprayed. The method may include adjusting a degree of parallelization of the display substrate. The method may include discharging the deposition material from the chamber to an outside of the chamber. The method may include adjusting a thickness at which the deposition material is deposited onto the display substrate.

The thickness at which the deposition material is deposited onto the display substrate may be adjusted by adjusting at least one of a temperature of a substrate fixer in which the display substrate is mounted, an amount of the deposition material supplied into the chamber, and an amount of the deposition material discharged to the outside of the chamber. The method may include adjusting a temperature of a nozzle head via which the deposition material is sprayed. The method may include adjusting a temperature of a substrate fixer in which the display substrate is mounted.

The deposition material may include a plurality of different deposition materials, and the plurality of different deposition materials may be sequentially or simultaneously deposited onto the display substrate. The deposition material may include a plurality of different deposition materials, and the plurality of different deposition materials are mixed in the chamber.

The method may include supplying a blocking gas to an edge portion of the display substrate, from a top surface of the chamber toward the display substrate. The deposition material may be supplied into the chamber via a carrier gas. A flowing amount of the deposition material may be adjusted via the carrier gas.

In accordance with one or more other embodiments, a method of manufacturing a display apparatus includes introducing a display substrate into a chamber; spraying and depositing a deposition material onto an entire surface of the display substrate; and adjusting a thickness at which the deposition material is deposited onto the display substrate by adjusting at least one of a temperature of a nozzle head spraying the deposition material, a temperature of a substrate fixer in which the display substrate is mounted, an amount of the deposition material supplied to the chamber, and an amount of the deposition material discharged outside of the chamber.

In accordance with one or more other embodiments, a method of manufacturing a display apparatus includes introducing a display substrate into a chamber; spraying and depositing a plurality of different deposition materials onto an entire surface of the display substrate; and adjusting a mixing ratio of the plurality of different deposition materials.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
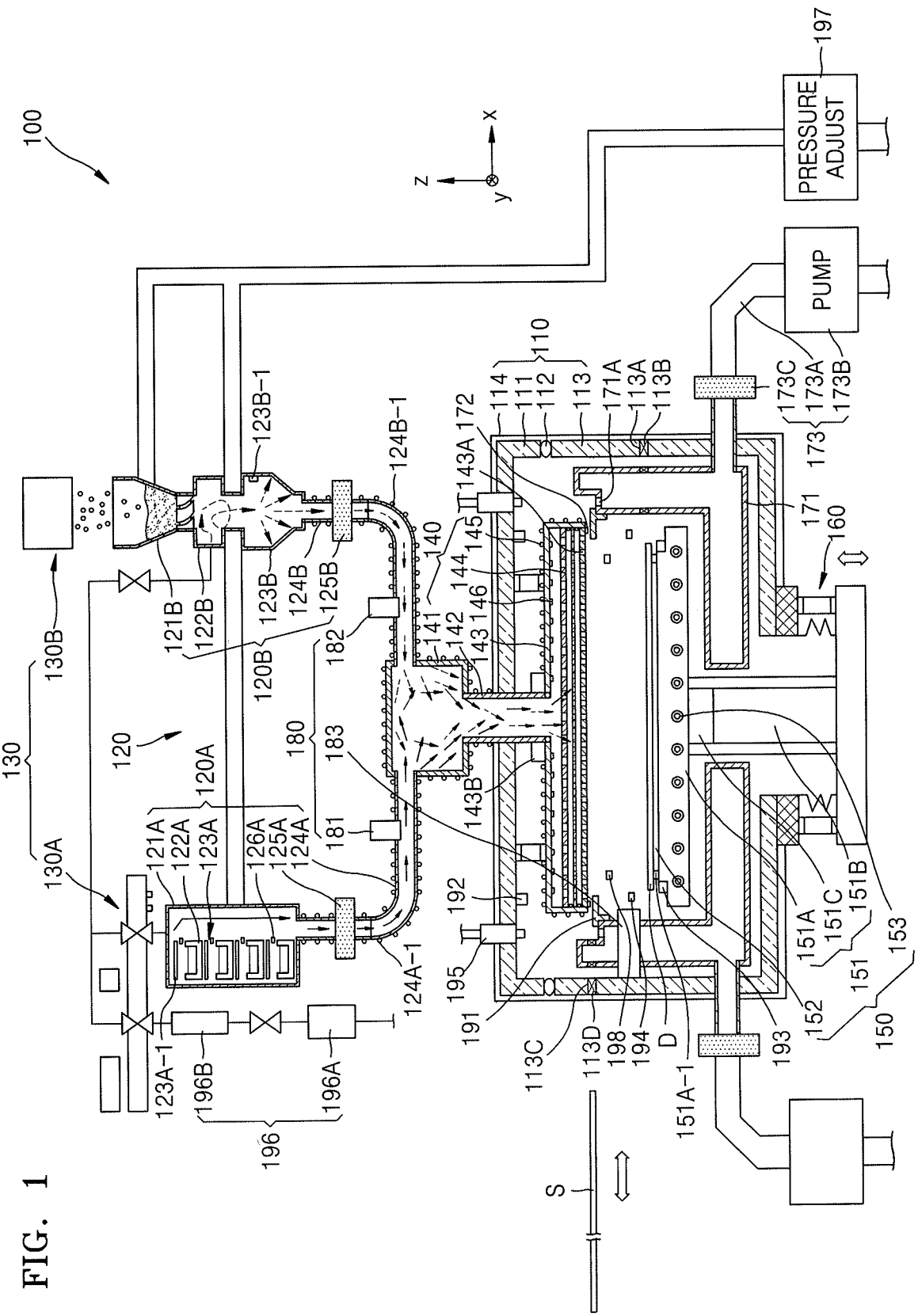
FIG. 1 illustrates an embodiment of an apparatus for manufacturing a display apparatus.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
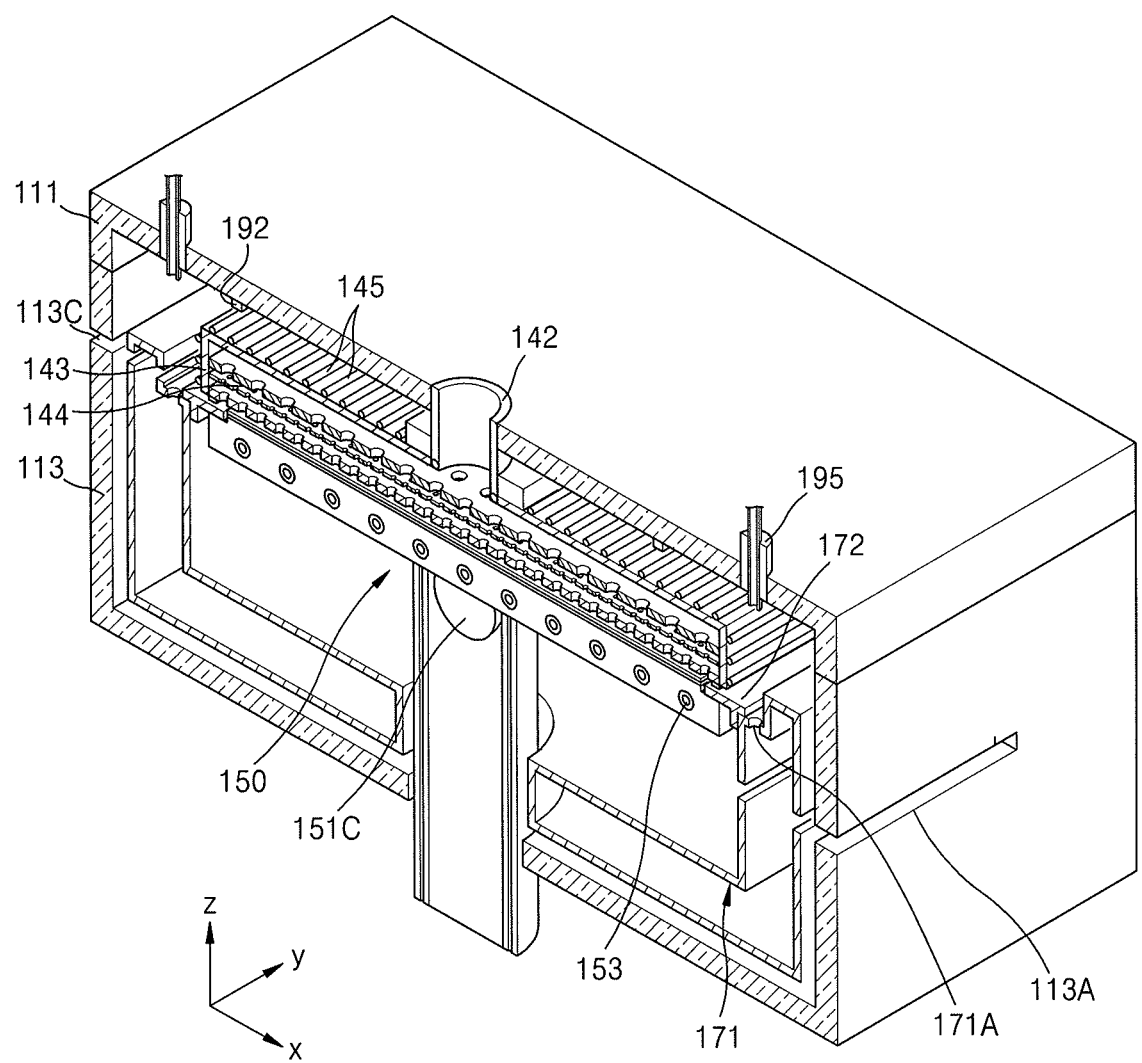
FIG. 2 illustrates an embodiment of a perspective view of a portion of the display apparatus in FIG. 1.

FIG. 1 illustrates an embodiment of an apparatus 100 for manufacturing a display apparatus. FIG. 2 illustrates an embodiment of a perspective view of a portion of the apparatus 100 illustrated in FIG. 1.

Referring to FIGS. 1 and 2, the apparatus 100 includes a chamber 110, a deposition source unit 120, a material supply unit 130, a nozzle head 140, a substrate fixing unit 150, a linear driving unit 160, a deposition preventing unit 171, a covering unit 172, a chamber pressure adjusting unit 173, a blocking gas supply unit 195, a sensing unit 180, and a distance measuring unit 191.

The chamber 110 may include a first housing 111, a sealing unit 112, and a second housing 113. The first housing 111 and the second housing 113 may be coupled to each other to form a space in which deposition is performed. The nozzle head 140 may be inside the first housing 111. The second housing 113 may include a first opening 113A, through which a display substrate D or a mask assembly M is inserted or withdrawn, and a second opening 113C through which a shutter S is inserted or withdrawn. A first gate valve 113B and a second gate valve 113D may be in the first opening 113A and the second opening 113C, respectively. The first gate valve 113B may selectively open and close the first opening 113A. The second gate valve 113D may selectively open and close the second opening 113C. The sealing unit 112 may be between the first housing 111 and the second housing 113, to seal a portion in which the first housing 111 is coupled to the second housing 113.

The chamber 110 may also include a chamber cooler 114. The chamber cooler 114 may include a fluid channel through which a refrigerant is circulated in the chamber 110. According to one embodiment, the chamber cooler 114 may surround the outside of the chamber 110 and cool the chamber 110. For convenience of explanation, the case in which the chamber cooler 114 is arranged to externally surround the chamber 110 will be described in detail.

The deposition source unit 120 may be outside the chamber 110 to vaporize or sublimate a deposition material. The deposition source unit 120 may vaporize or sublimate only a predetermined amount of the deposition material. For example, a portion of the deposition source unit 120, in which the deposition material is received, may be replaced after deposition on the display substrate D is completed, or only a predetermined amount of the deposition material may be supplied to the deposition source unit 120. Because there is no deposition material in the deposition source unit 120, a change of the deposition material due to residual heat of the deposition source unit 120 may be prevented.

The deposition source unit 120 may vaporize or sublimate the deposition material in various ways. For example, the deposition source unit 120 may include a sheath heater and may directly apply heat to the deposition material via the sheath heater. According to one embodiment, the deposition source unit 120 may include a coil heater and may heat the deposition material using an induction heating method. According to one embodiment, the deposition source unit 120 may include a lamp heater to heat the deposition material using an indirect heating method. The deposition source unit 120 may directly or indirectly heat the deposition material in various other ways in other embodiments.

At least one deposition source unit 120 may be provided. In one embodiment, when multiple deposition source units 120 are provided, the deposition source units 120 may be identically formed. According to one embodiment, the deposition source units 120 may be formed to be different from one another. Also, the deposition source units 120 may supply identical or different deposition materials.

The deposition source units 120 may include a first deposition source unit 120A supplying a deposition material by heating the deposition material, and a second deposition source unit 120B supplying a deposition material by heating the deposition material. The first deposition source unit 120A and the second deposition source unit 120B may separately supply the deposition materials.

The first deposition source unit 120A may include a deposition source chamber 121A, a crucible 122A, a source heating unit 123A, a first connection pipe 124A, and a first valve 125A. The deposition source chamber 121A may include a space and the crucible 122A may be in the deposition source chamber 121A. The deposition source chamber 121A may have an opening which is selectively opened and closed, for example, via a door capable of sliding, a door configured to be rotatable, or a gate valve. The deposition source chamber 121A may be connected to and separated from the first connection pipe 124A.

The crucible 122A may have the shape of a container for receiving a deposition material. The crucible 122A may be formed such that a portion of the crucible 122A is open so that a deposition material may be introduced through the opening or a heated deposition material may be discharged through the opening. Also, the crucible 122A may be separated from the deposition source chamber 121A. At least one crucible 122A may be provided. When multiple crucibles 122A are provided, the plurality of crucibles 122A may be apart from one another in a height direction of the deposition source chamber 121A.

In this case, the deposition material may be vaporized or sublimated in various ways. For example, the deposition material may be simultaneously vaporized or sublimated via the crucibles 122A. According to one embodiment, the deposition material may be sequentially vaporized or sublimated via the crucibles 122A. In this case, after the deposition material received in any one of the crucibles 122A is completely consumed, the deposition material in another one of the crucibles 122A may be vaporized or sublimated.

When the deposition material is simultaneously vaporized or sublimated via the crucibles 122A, the deposition material accommodated in each of the crucibles 122A may receive a different amount of heat. For example, the deposition material in a lowermost crucible 122A may receive a greater amount of heat than the deposition material in an uppermost crucible 122A. For example, the deposition material in the uppermost crucible 122A may require a lower amount of heat to be vaporized or sublimated than the deposition material in the crucibles 122A below the uppermost crucible 122A. This is because the heat applied to the crucibles 122A below the uppermost crucible 122A increases the initial temperature of the uppermost crucible 122A and the deposition material accommodated therein.

In this case, the amount of heat applied to the deposition material in each crucible 122A may linearly decrease from a lower portion of the deposition source chamber 121A to an upper portion of the deposition source chamber 121A. Thus, when the crucibles 122A are arranged as described above, it is possible to reduce the total amount of heat to vaporize or sublimate the deposition material. Also, when multiple crucibles 122A are provided, the area of the deposition material exposed to heat while performing deposition may be increased or maximized.

The source heating unit 123A may include at least one of the sheath heater, the coil heater, and the lamp heater. In one embodiment, the source heating unit 123A may include multiple devices and structures for vaporizing or sublimating a deposition material in the crucible 122A, by directly or indirectly applying heat to the crucible 122A. The source heating unit 123A may be mounted on at least one of the crucible 122A and the deposition source chamber 121A. When multiple crucibles 122A are provided, a plurality of source heating units 123A may be mounted on the crucibles 122A, respectively. The source heating units 123A may separately operate and adjust temperatures of the crucibles 122A to be the same as or different from one another.

Each of the source heating units 123A may include a first source heating unit 123A-1, which is arranged apart from the crucible 122A and which directly heats a surface of the deposition material, and a second source heating unit which is arranged in the crucible 122A and heats the crucible 122A. For example, the first source heating unit 123A-1 may be on the opening of the crucible 122A and heat the deposition material.

The first connection pipe 124A may connect the deposition source chamber 121A with the nozzle head 140. A first connection pipe heater 124A-1 may be in the first connection pipe 124A. The first connection pipe heater 124A-1 may heat the first connection pipe 124A to increase the temperature of the deposition material flowing through the first connection pipe 124A or to vaporize or sublimate the deposition material that has not vaporized or sublimated.

A first valve 125A may be mounted on the first connection pipe 124A. The first valve 125A may adjust the degree of opening of the first connection pipe 124A.

The second deposition source unit 120B may include a fixed-quantity-material supply unit 121B, an aerosol generator 122B, a rapid vaporizer 123B, a second connection pipe 124B, and a second valve 125B. The fixed-quantity-material supply unit 121B may supply to the aerosol generator 122B a fixed quantity of a deposition material from an external source.

In one embodiment, the fixed-quantity-material supply unit 121B may include a screw. When the screw rotates, a fixed quantity of deposition material may be supplied to the aerosol generator 122B. According to one embodiment, the fixed-quantity-material supply unit 121B may include a rotating disc including a groove. A fixed quantity of deposition material may be received by the groove, and then may be supplied to the aerosol generator 122B when the disc rotates. In other embodiments, different fixed-quantity-material supply units 121B may be used to supply a fixed quantity of the deposition material from the external source to the aerosol generator 122B.

The fixed-quantity-material supply unit 121B may adjust the quantity of the deposition material to be supplied based on an amount (or a concentration or a pressure) of the deposition material flowing through the second connection pipe 124B. For example, when the amount of deposition material flowing through the second connection pipe 124B is less than a predetermined amount, the fixed-quantity-material supply unit 121B may increase the quantity of deposition material to be supplied to the aerosol generator 122B. When the amount of the deposition material flowing through the second connection pipe 124B is greater than the predetermined amount, the fixed-quantity-material supply unit 121B may decrease the quantity of deposition material to be supplied to the aerosol generator 122B.

The aerosol generator 122B may scatter the deposition material supplied from the fixed-quantity-material supply unit 121B. An inert gas (or a carrier gas) or the like may be supplied to the aerosol generator 122B to scatter the deposition material and increase the distance between particles of the deposition material. Also, when the inert gas (or the carrier gas) or the like is supplied to the aerosol generator 122B, the flow of scattered deposition material to the fixed-quantity-material supply unit 121B may be reduced or minimized.

The rapid vaporizer 123B may vaporize or sublimate the deposition material supplied from the aerosol generator 122B. The rapid vaporizer 123B may directly or indirectly apply heat to the deposition material therein. The rapid vaporizer 123B may include a sheath heater, a coil heater, a lamp heater, etc., as described above.

The second connection pipe 124B may connect the rapid vaporizer 123B with the nozzle head 140. A second connection pipe heater 124B-1 may be mounted on the second connection pipe 124B. In one embodiment, the second connection pipe heater 124B-1 may be the same or substantially the same as the first connection pipe heater 124A-1 described above.

The second valve 125B may be in the second connection pipe 124B and may adjust a degree of opening of the second connection pipe 124B.

The material supply unit 130 may be connected to the deposition source unit 120 and may provide the deposition material to the deposition source unit 120. The material supply unit 130 may supply a fixed quantity of the deposition material to the deposition source unit 120. For example, the material supply unit 130 may supply to the deposition source unit 120 a fixed quantity of the deposition material to be deposited on one display substrate D. The material supply unit 130 may supply to the deposition source unit 120 the deposition material that is to be deposited on one display substrate D.

The material supply unit 130 may supply the deposition material to the deposition source unit 120 in various ways. For example, the material supply unit 130 may supply the deposition material to the deposition source unit 120 via a pump. According to one embodiment, the material supply unit 130 may have, for example, the shape of a cylinder, to supply the deposition material to the deposition source unit 120.

According to one embodiment, the material supply unit 130 may be on the deposition source unit 120 and may supply the deposition material to the deposition source unit 120 via its weight. According to one embodiment, the material supply unit 130 may have the shape of a screw and may supply a fixed quantity of the deposition material to the deposition source unit 120. According to one embodiment, the material supply unit 130 may supply the deposition material to the deposition source unit 120 using a method of replacing a crucible therein. According to one embodiment, the material supply unit 130 may sequentially supply the deposition material to the deposition source unit 120. A different type of material supply unit 130 for sequentially supplying the deposition material to the deposition source unit 120 may be used in another embodiment.

The material supply unit 130 may include a first material supply unit 130A connected to the first deposition source unit 120A, and a second material supply unit 130B connected to the second deposition source unit 120B. The first material supply unit 130A may supply a deposition material to the first deposition source unit 120A and the second material supply unit 130B may supply a deposition material to the second deposition source unit 120B.

The nozzle head 140 may be connected to at least one of the first connection pipe 124A and the second connection pipe 124B. The nozzle head 140 may have various forms. For example, the nozzle head 140 may mix deposition materials supplied from the first connection pipe 124A and the second connection pipe 124B and spray the mixed deposition materials onto the display substrate D. According to one embodiment, the nozzle head 140 may separately spray the deposition material supplied from the first connection pipe 124A and the deposition material supplied from the second connection pipe 124B onto the display substrate D.

The display substrate D may be fixedly arranged on the substrate fixing unit 150. The substrate fixing unit 150 may be mounted in the chamber 110 so that it is able to ascend and descend.

The substrate fixing unit 150 may include a substrate mounting unit 151, a substrate holding unit 152, and a temperature adjusting unit 153. The substrate mounting unit 151 may be connected to the linear driving unit 160. The substrate mounting unit 151 may include a mounting plate 151A, a connection unit 151B, and a lift pin 151A-1. The display substrate D is mounted over the mounting plate 151A. The connection unit 151B extends from the mounting plate 151A and through the chamber 110. The lift pin 151A-1 is in the mounting plate 151A.

A cooling pin may be inside or outside the mounting plate 151A. In this case, a mounting plate operating unit 151C may be additionally included between the mounting plate 151A and the connection unit 151B. The mounting plate operating unit 151C may move the mounting plate 151A. The mounting plate 151A and the connection unit 151B may be connected to each other, for example, via a ball bearing. In this case, a degree of parallelization between the mounting plate operating unit 151C and the mounting plate 151A may be adjusted.

The mounting plate operating unit 151C may be the same or substantially the same as a head operating unit 143B. The lift pin 151A-1 may be withdrawn from or inserted into the substrate mounting unit 151 when the display substrate D is mounted over the substrate mounting unit 151 or withdrawn from the chamber 110.

The substrate holding unit 152 may be mounted on the substrate mounting unit 151. The substrate holding unit 152 may include an electrostatic chuck. In this case, the linear driving unit 160 may be grounded.

The temperature adjusting unit 153 may be mounted in the substrate mounting unit 151. The temperature adjusting unit 153 may be formed in various forms. For example, the temperature adjusting unit 153 may include a circulation pipe in the substrate mounting unit 151 for circulating a refrigerant or a heat medium. According to one embodiment, the temperature adjusting unit 153 may include a Peltier device or a heater mounted in the substrate mounting unit 151.

In one embodiment, multiple temperature adjusting units 153 may be included. The temperature adjusting units 153 may be arranged in various forms. For example, the temperature adjusting units 153 may be in the substrate mounting unit 151 and separated from one another. A refrigerant or a heat medium may be circulated in each circulation pipe to adjust a temperature of each area of the substrate mounting unit 151.

According to one embodiment, one of the temperature adjusting units 153 may be on the entire area of the substrate mounting unit 151. A remainder of the temperature adjusting units 153 may be respectively arranged on the different areas of the substrate mounting unit 151.

According to one embodiment, the substrate mounting unit 151 may be divided into a plurality of areas. Each of the areas of the substrate mounting unit 151 may have a different number of temperature adjusting units 153 arranged therein. The arrangement of temperature adjusting units 153 may be different in other embodiments.

The linear driving unit 160 may have various forms. For example, the linear driving unit 160 may include a cylinder connected to the connection unit 151B. According to one embodiment, the linear driving unit 160 may include a linear motor connected to the connection unit 151B. According to one embodiment, the linear driving unit 160 may include a ball screw connected to the connection unit 151B and a motor connected to the ball screw. According to one embodiment, the linear driving unit 160 may include a rack gear connected to the connection unit 151B, a spur gear connected to the rack gear, and a motor connected to the spur gear. The linear driving unit 160 may have a different configuration in another embodiment for allowing the connection unit 151B to ascend or descend.

The deposition preventing unit 171 may be in the chamber 110 to surround an edge of the nozzle head 140 and an edge of the substrate mounting unit 151. The deposition preventing unit 171 may include a space therein and may guide gas inside the chamber 110 to the outside. Also, a temperature of the deposition preventing unit 171 may be adjusted. The deposition preventing unit 171 may include, for example, a metal material which may be connected to external power to increase a temperature thereof. According to one embodiment, the deposition preventing unit 171 may include a heater connected to external power.

The deposition preventing unit 171 may surround the entire inner surface of the chamber 110. An intake hole 171A for inhaling the gas in the chamber 110 may be in the deposition preventing unit 171. Multiple intake holes 171A may be provided and arranged apart from one another on an external surface of the deposition preventing unit 171. For example, the intake holes 171A may separately guide the gas in the chamber 110 to the outside. In this case, each intake hole 171A may be connected to one chamber pressure adjusting unit 173, so that concentrations of gas in different areas of the chamber 110 may be adjusted differently via each intake hole 171A. Also, the deposition preventing unit 171 may include an opening connected to each of the first opening 113A and the second opening 113C. A gate valve may be additionally arranged in the opening.

The covering unit 172 may be connected to the deposition preventing unit 171. The covering unit 172 may be arranged at the opening of the deposition preventing unit 171. In this case, the covering unit 172 may face the nozzle head 140. For example, the center of the covering unit 172 may have an opening therein, and the covering unit 172 may be on the deposition preventing unit 171. In one embodiment, the covering unit 172 may protrude from an upper portion of the deposition preventing unit 171 to the center of the chamber 110. For example, the covering unit 172 may shield an edge of the mounting plate 151A when the substrate mounting unit 151 ascends. In this case, a bottom surface of the covering unit 172 and the edge of the mounting plate 151A may contact each other, while having a step difference.

The chamber pressure adjusting unit 173 may include a chamber guide pipe 173A, a chamber pump 173B, and a blocking valve 173C. The chamber guide pipe 173A may be connected to the inside of the chamber 110 and the intake hole 171A. In one embodiment, multiple chamber guide pipes 173A may be provided and connected to the intake holes 171A, respectively. The chamber pump 173B may be connected to the chamber guide pipe 173A. In one embodiment, multiple chamber pumps 173B may be connected to the chamber guide pipes 173A, respectively.

According to one embodiment, a single chamber pump 173B may be provided, and the chamber guide pipes 173A may be connected to a manifold for adjusting an amount of gas flowing through each of the chamber guide pipes 173A. According to one embodiment, the chamber guide pipes 173A may be connected to one chamber pump 173B, and a blocking valve 173C may be in each of the chamber guide pipes 173A to adjust a degree of opening of each of the chamber guide pipes 173A.

The sensing unit 180 may be in at least one of the first connection pipe 124A, the second connection pipe 124B, and the deposition preventing unit 171, and may measure at least one of a flowing amount of a deposition material, a concentration of the deposition material, and a pressure of the deposition material at a measured point. The deposition material may flow through at least one of the first connection pipe 124A, the second connection pipe 124B, and the deposition preventing unit 171.

The sensing unit 180 may include a first sensing unit 181 in the first connection pipe 124A to measure the flowing amount (or a concentration) of deposition material of the first connection pipe 124A. The sensing unit 180 may include a second sensing unit 182 in the second connection pipe 124B to measure the flowing amount (or a concentration) of deposition material of the second connection pipe 124B. The first sensing unit 181 and the second sensing unit 182 may be the same or different types of sensing units.

The first sensing unit 181 may be formed in various forms. For example, the first sensing unit 181 may include a sensor measuring an amount of material via physical adsorption and using a quartz crystal microbalance. According to one embodiment, the first sensing unit 181 may include a sensor irradiating light using an optical characteristic of molecular gases and sensing a generated fluorescent signal. For example, the first sensing unit 181 may include a light source and a light-receiving sensor outside the first connection pipe 124A, and a transparent viewport may be in the first connection pipe 124A so that light from the light source passes into the first connection pipe 124A and the fluorescent signal reaches the light-receiving sensor.

According to one embodiment, the first sensing unit 181 may include a sensor using distribution or absorption characteristic generated by irradiating light. In this case, the first sensing unit 181 may be outside the first connection pipe 124A, and a viewport including a transparent material may be in the first connection pipe 124A.

According to one embodiment, the first sensing unit 181 may include a sensor measuring the flowing amount based on a change in pressure in the first connection pipe 124A. The first sensing unit 181 may include, for example, a Pirani gauge, a capacitance manometer gauge, or the like, for measuring the pressure at high temperatures. The first sensing unit 181 may be a different type of device in another embodiment.

In one embodiment, multiple first sensing units 181 and multiple second sensing units 182 may be provided. In this case, amounts of deposition materials flowing through the first connection pipe 124A and the second connection pipe 124B may be calculated, for example, based on arithmetic average values of flowing amounts of deposition materials measured by the first sensing units 181 and the second sensing units 182.

The sensing unit 180 may further include a third sensing unit 183 in the deposition preventing unit 171 for measuring the amount (or concentration) of deposition material flowing through the deposition preventing unit 171. In one embodiment, multiple third sensing units 183 may be provided on a path through which a deposition material taken by each intake hole 171A flows. The multiple third sensing units 183 may sense the flowing amount of deposition material taken by each intake hole 171A. The third sensing unit 183 may be the same or different from the first sensing unit 181.

The distance measuring unit 191 may be in the chamber 110 for measuring the distance between a surface of the nozzle head 140 and the display substrate D, or the distance between a surface of the nozzle head 140 and the mounting plate 151A.

The distance measuring unit 191 may be mounted in the chamber 110. In this case, the distance measuring unit 191 may sense the location of a surface of the nozzle head 140 and the location of the display substrate D. Then, based on the sensed locations, the distance measuring unit 191 may calculate the distance between the nozzle head 140 and the display substrate D. According to one embodiment, the distance measuring unit 191 may be mounted on the nozzle head 140.

The distance measuring unit 191 may include, for example, a gap sensor. According to one embodiment, the distance measuring unit 191 may also include a camera. The distance measuring unit 191 may be different in another embodiment, provided it measures the distance between a surface of the nozzle head 140 and the display substrate D.

The apparatus 100 for manufacturing a display substrate may further include a vision unit 192, an alignment unit 193, a mask mounting unit 194, a blocking gas supply unit 195, a carrier gas supply unit 196, a deposition source pressure adjusting unit (pressure adjust) 197, and a substrate-state sensing unit 198, in addition to the components described above.

The vision unit 192 may be in the chamber 110 for measuring the location of at least one of the display substrate D and the mask assembly M. The vision unit 192 may include, for example, a camera.

The alignment unit 193 may adjust the location of the display substrate D mounted over the substrate fixing unit 150. The alignment unit 193 may be integrally formed with the substrate fixing unit 150, and may move an upper surface of the substrate fixing unit 150, the upper surface contacting the display substrate D, in a first direction or a second direction different from the first direction, or may rotate the upper surface of the substrate fixing unit 150. The alignment unit 193 may include, for example, an XY-theta alignment stage.

The mask assembly M may be mounted on the mask mounting unit 194. The mask mounting unit 194 may include a structure for minutely adjusting the position of the mask assembly M. This structure may be the same as or different from the alignment unit 193. The mask mounting unit 194 may arrange the mask assembly M between the nozzle head 140 and the display substrate D. For example, the mask mounting unit 194 may be in the chamber 110 and capable of linear motion, in order to allow the mask assembly M to adhere to the display substrate D. Also, openings may be formed in the chamber 110 and the deposition preventing unit 171 to allow the mask assembly M to penetrate through the openings. Also, gate valves may be arranged in the openings.

The blocking gas supply unit 195 may be in the chamber 110 and may supply a blocking gas into the chamber 110. The blocking gas may include an inert gas such as nitrogen, argon, etc. The blocking gas supply unit 195 may supply the blocking gas to surround an edge portion of the nozzle head 140. The blocking gas may be supplied from the nozzle head 140 toward the substrate fixing unit 150. For example, the blocking gas may be supplied from the edge portion of the nozzle head 140 toward an edge of the display substrate D.

The carrier gas supply unit 196 may be connected to the deposition source unit 120. For example, the carrier gas supply unit 196 may be connected to the deposition source chamber 121A and the aerosol generator 122B. The carrier gas supply unit 196 may supply a carrier gas to the deposition source chamber 121A and the aerosol generator 122B. The carrier gas may include an inert gas, such as argon or nitrogen.

The carrier gas supply unit 196 may include a carrier gas storage chamber in which the carrier gas is stored, a carrier gas supply pump 196A for supplying the carrier gas stored in the carrier gas storage chamber, and a flowing amount adjusting unit 196B for adjusting movement of the carrier gas supply pump 196A. The carrier gas supply unit 196 may supply the carrier gas to each of the deposition source chamber 121A and the aerosol generator 122B, thereby preventing a vaporized or sublimated deposition material from becoming stagnant. Thus, the carrier gas supply unit 196 may increased or maximize a vaporized or sublimated area of the deposition material.

The deposition source pressure adjusting unit 197 may be connected to the deposition source unit 120 and may adjust a pressure inside the deposition source unit 120. The deposition source pressure adjusting unit 197 may include, for example, a pump on a pipe connected to the deposition source unit 120. Operation of the deposition source pressure adjusting unit 197 may be the same or different from the chamber pressure adjusting unit 173.

The substrate-state sensing unit 198 may be in at least one of the chamber 110 and the substrate fixing unit 150. In one embodiment, multiple substrate-state sensing units 198 may be arranged in various locations to sense a state of the display substrate D. For example, the substrate-state sensing unit 198 may sense at least one of a thickness of a deposition material deposited on the display substrate D, a temperature of the display substrate D, a pressure distribution of the deposition material on the display substrate D, and a particle distribution of the deposition material on the display substrate D. The substrate-state sensing unit 198 may be the same or different from sensing unit 180 described above.

A method of manufacturing a display apparatus using the apparatus 100 for manufacturing a display apparatus described above will be described. According to the method, the display substrate D may be manufactured and prepared. The display substrate D may include various layers that are stacked, before a deposition material is spread on the display substrate D via the apparatus 100 for manufacturing a display apparatus. The deposition material may include an organic material, which may be included in various layers of the display apparatus.

The chamber pressure adjusting unit 173 may adjust the pressure in the chamber 110 to be a predetermined pressure, e.g., the same or substantially the same as atmospheric pressure. The first gate valve 113 may be opened and the display substrate D may be inserted into the chamber 110 and arranged over the substrate mounting unit 151. Also, the mask assembly M may be mounted and fixed on the mask mounting unit 194. In this case, the display substrate D and the mask assembly M may be inserted into the chamber 10, for example, via a robot outside the chamber 110. Also, the mask assembly M may be mounted over the substrate mounting unit 151, rather than on the mask mounting unit 194, together with display substrate D.

When the display substrate D and the mask assembly M are mounted on the mask mounting unit 194, the chamber pressure adjusting unit 173 may discharge gas from the chamber 110 to the outside to place the pressure inside the chamber 110 in a vacuum state.

When the display substrate D and the mask assembly M are mounted on the mask mounting unit 194, the substrate mounting unit 151 may ascend. The substrate mounting unit 151 may ascend to a predetermined height to contact the covering unit 172. The covering unit 172 and the substrate mounting unit 151 may be arranged such that a space formed by a lower surface of the substrate mounting unit 151 and the deposition preventing unit 171 is separate from a space formed by an upper surface of the substrate mounting unit 151 and the nozzle head 140.

When the substrate mounting unit 151 ascends, the vision unit 192 may photograph locations of the display substrate D and the mask assembly M. When the photographed locations of the display substrate D and the mask assembly M do not correspond to predetermined locations, or the location of the display substrate D and the location of the mask assembly M are different from each other, at least one of the locations of the display substrate D and the mask assembly M may be changed via the alignment unit 193, the mask mounting unit 194. This operation may be stopped when the locations of the display substrate D and the mask assembly M correspond to the predetermined locations.

The material supply unit 130 may supply a deposition material to the deposition source unit 120. The first material supply unit 130A may supply the deposition material to the first deposition source unit 120A. Also, the second material supply unit 130B may supply the deposition material to the fixed-quantity-material supply unit 121B.

The deposition source pressure adjusting unit 197 may adjust the pressure in the deposition source chamber 121A and the fixed-quantity-material supply unit 121B, for example, to be the same or substantially the same as atmospheric pressure. After supply of the deposition material is completed, the deposition source pressure adjusting unit 197 may adjust the pressure in the deposition source chamber 121A and the fixed-quantity-material supply unit 121B to be the same or substantially the same as that of a vacuum state.

As described above, when the deposition material is supplied to deposition source unit 120, the deposition source unit 120 may operate to vaporize or sublimate the deposition material. The first deposition source unit 120A and the second deposition source unit 120B may simultaneously or sequentially operate.

With respect to operation of the first deposition source unit 120A, after the crucible 122A is in the deposition source chamber 121A, the source heating unit 123A may operate to heat the crucible 122A. When a plurality of crucibles 122A are included, the source heating unit 123A may heat the crucibles 122A by applying identical or different amounts of heat to the crucibles 122A.

In this case, the source heating unit 123A may operate based on at least one of a pressure of a deposition material of each crucible 122A, a concentration of the deposition material of each crucible 122A, a flowing amount of the deposition material of each crucible 122A, and a temperature of each crucible 122A. A crucible sensing unit 126A may be in the deposition source chamber 121A for measuring at least one of the pressure of the deposition material of each crucible 122A, the concentration of the deposition material of each crucible 122A, the flowing amount of the deposition material of each crucible 122A, and a temperature of each crucible 122A. The crucible sensing unit 126 may be the same or different from the sensing unit 180 described above.

In one embodiment, the crucible sensing unit 126A may include a sensor for measuring the temperature of each crucible 122A using a non-contact or a contact method. Operation of the source heating unit 123A mounted on each crucible 122A may be adjusted based on results of the sensing described above. The relationship between the operation of the source heating unit 123A and at least one of the pressure of the deposition material of each crucible 122A, the concentration of the deposition material of each crucible 122A, the flowing amount of the deposition material of each crucible 122A, and the temperature of each crucible 122A, may be pre-set, for example, in the form of a table. For example, when at least one of the pressure of the deposition material of each crucible 122A, the concentration of the deposition material of each crucible 122A, the flowing amount of the deposition material of each crucible 122A, and the temperature of each crucible 122A exceeds a predetermined value, the source heating unit 123A may be controlled to stop the operation. When at least one of the pressure of the deposition material of each crucible 122A, the concentration of the deposition material of each crucible 122A, the flowing amount of the deposition material of each crucible 122A, and the temperature of each crucible 122A is less than the predetermined value, the source heating unit 123A may be controlled to operate or provide a greater amount of heat.

The deposition material may be vaporized or sublimated and may move from the crucible 122A to a mixing unit 141 through the first connection pipe 124A. The carrier gas supply unit 196 may supply a carrier gas into the deposition source chamber 121A. The carrier gas may provide a moving force for moving the deposition material from the first connection pipe 124A to the mixing unit 141. The first valve 125A may adjust a degree of opening of the first connection pipe 124A to adjust the amount of deposition material flowing through first connection pipe 124A. According to another embodiment, the carrier gas supply unit 196 may adjust an amount of supplied carrier gas to adjust the amount of deposition material flowing through the first connection pipe 124A.

Also, when the deposition material flows through the first connection pipe 124A, the first connection pipe heater 124A-1 may increase the temperature of the first connection pipe 124A or adjust the temperature of the first connection pipe 124A to within a predetermined range of temperatures.

With respect to the operation of the second deposition source unit 120B, the second material supply unit 130B may supply the deposition material to the fixed-quantity-material supply unit 121B. The fixed-quantity-material supply unit 121B may supply a predetermined small fixed quantity of the deposition material to the aerosol generator 122B. The fixed-quantity-material supply unit 121B may supply the predetermined fixed quantity of the deposition material to the aerosol generator 122B, for example, based on a predetermined time. The carrier gas supply unit 196 may supply a carrier gas to the aerosol generator 122B. The carrier gas may be supplied to the aerosol generator 122B to increase distances between particles of the deposition material, thereby scattering the deposition material. In this case, the entire area of the deposition material may be increased.

The scattered deposition material may be delivered to the rapid vaporizer 123B to be vaporized or sublimated. The deposition material may not be supplied to the rapid vaporizer 123B in a lump form. Rather, the deposition material may be scattered. Thus, the entire area of the deposition material is increased, and the deposition material may be rapidly vaporized or sublimated by a small amount of heat.

A rapid vaporizer sensing unit 123B-1 may be in the rapid vaporizer 123B to sense one of a temperature inside the rapid vaporizer 123B, a temperature of a heater included in the rapid vaporizer 123B, and a temperature of the rapid vaporizer 123B itself. The rapid vaporizer 123B may be controlled, for example, based on a value measured by the rapid vaporizer sensing unit 123B-1. For example, when the value measured by the rapid vaporizer sensing unit 123B-1 exceeds a predetermined value, the rapid vaporizer 123B may not increase or decrease the temperature inside the rapid vaporizer 123B. When the value measured by the rapid vaporizer sensing unit 123B-1 is less than the predetermined value, the rapid vaporizer 123B or the heater in the rapid vaporizer 123B may increase the temperature inside the rapid vaporizer 123B.

After passing through the rapid vaporizer 123B, the deposition material may be supplied to the mixing unit 141 through the second connection pipe 124B. The second valve 125B may control the amount of deposition material flowing through the second connection pipe 124B by adjusting the degree of opening of the second connection pipe 124B. According to one embodiment, the amount of deposition material flowing through the second connection pipe 124B may be adjusted via the carrier gas supply unit 196. Also, the second connection pipe heater 124B-1 may operate in the manner of the first connection pipe heater 124A-1 to increase the temperature of the second connection pipe 124B or to adjust the temperature of the second connection pipe 124B to within a predetermined range of temperatures.

The deposition material introduced to the mixing unit 141 may be supplied to a nozzle head body unit 143 by flowing through a supply pipe 142. The deposition material may be distributed to the entire area of the nozzle head body unit 143 via a baffle unit 144. Thus, a uniform concentration thereof may be maintained in the entire area of the nozzle head body unit 143. The deposition material may be supplied to the display substrate D via a discharge hole 143A of the nozzle head body unit 143. The nozzle head 140 may have a temperature within a predetermined range of temperatures. For example, the entire nozzle head 140 may have a uniform temperature.

When the deposition material is supplied to the display substrate D as described above, the blocking gas supply unit 195 may supply a blocking gas. The blocking gas may be supplied from an edge of the nozzle head 140 to an edge of the display substrate D, to thereby block the edge of the display substrate D. For example, the blocking gas may prevent the deposition material sprayed from the nozzle head 140 from going beyond the edge of the display substrate D and moving to the covering unit 172. Thus, due to the blocking gas, the deposition material may reach the display substrate D without being dispersed.

While the deposition material is sprayed onto the display substrate D, the chamber pressure adjusting unit 173 may operate to discharge the deposition material, the carrier gas, and the blocking gas from the chamber 110 to the outside. The chamber pressure adjusting unit 173 may operate based on various factors. For example, the chamber pressure adjusting unit 173 may operate to maintain a pressure of the chamber 110 within a predetermined range of pressures. In this case, a sensor measuring the pressure inside the chamber 110 may be in the chamber 110.

According to one embodiment, the chamber 110 may be divided into a plurality of areas, and the chamber pressure adjusting unit 173 may operate to maintain a concentration of the deposition material in each area within a predetermined range of concentrations. The concentration of the deposition material in each area may be measured by the sensor in each area.

The sensors for measuring the concentration of the deposition material may be arranged in the chamber 110 to be apart from one another at predetermined locations. When each area of the chamber 110 has a different concentration of the deposition material, the chamber pressure adjusting unit 173 may operate so that the concentration of the deposition material in each area is adjusted to be the same.

According to one embodiment, the chamber pressure adjusting unit 173 may operate so that the concentration of the deposition material in each area is adjusted to be different. According to another embodiment, the chamber pressure adjusting unit 173 may operate to adjust the flowing amount of deposition material, measured via the third sensing unit 183, so that it is within a predetermined range of flowing amounts.

When the chamber pressure adjusting unit 173 operates in the ways described herein, the flowing amount (or concentration) of deposition material may be uniform in the chamber 110. As a result, the thickness of the deposition material deposited on the entire surface of the display substrate D may be uniform.

According to another embodiment, the chamber pressure adjusting unit 173 may operate based on a value measured by the substrate-state sensing unit 198. When at least one of a pressure distribution of the deposition material on the display substrate D and a particle distribution (or concentration) of the deposition material on the display substrate D (which are measured by the substrate-state sensing unit 198) is compared with a predetermined value, and the measured value is less than the predetermined value, the chamber pressure adjusting unit 173 may discharge a lower amount of deposition material from the chamber 110. In the opposite case, the chamber pressure adjusting unit 173 may discharge a greater amount of deposition material from the chamber 110.

While the chamber pressure adjusting unit 173 may operate in the ways described above, the sensing unit 180 may measure an amount of deposition material flowing through at least one of the first connection pipe 124A, the second connection pipe 124B, and the deposition preventing unit 171. At least one of the first valve 125A and the second valve 125B may be controlled based on the flowing amount of the deposition material measured by the sensing unit 180. For example, the first sensing unit 181 may measure the flowing amount of deposition material in the first connection pipe 124A. The flowing amount of deposition material measured by the first sensing unit 181 may be compared with a predetermined flowing amount of deposition material. When the flowing amount of deposition material measured by the first sensing unit 181 is determined to be less than the predetermined flowing amount of deposition material, the first valve 125A may further open the first connection pipe 124A. When the flowing amount of deposition material measured by the first sensing unit 181 is determined to be greater than the predetermined flowing amount of deposition material, the first valve 125A may adjust the degree of opening of the first connection pipe 124A to decrease the amount of deposition material flowing through the first connection pipe 124A.

A method of controlling the second valve 125B based on results measured by the second sensing unit 182 may be the same or substantially the same as the method of controlling the first valve 125A based on the results measured by the first sensing unit 181. For example, when the flowing amount of deposition material in the second connection pipe 124B, which is sensed by the second sensing unit 182, is less than a predetermined flowing amount of deposition material, the second valve 125B may further open the second connection pipe 124B. When the flowing amount of deposition material in the second connection pipe 124B, which is sensed by the second sensing unit 182, is greater than the predetermined flowing amount, the second valve 125B may further decrease the degree of opening of the second connection pipe 124B.

According to another embodiment, at least one of the first deposition source unit 120A and the second deposition source unit 120B may be controlled based on the flowing amount of deposition material measured by the sensing unit 180. For example, the first sensing unit 181 may measure the flowing amount of deposition material in the first connection pipe 124A. When it is determined that the flowing amount of deposition material measured by the first sensing unit 181 is less than a predetermined flowing amount of deposition material, the first deposition source unit 120A may further vaporize or sublimate the deposition material. In this case, the deposition material may further be vaporized or sublimated, due to an increase of the temperature of the source heating unit 123A. However, when it is determined that the flowing amount of deposition material measured by the first sensing unit 181 is greater than the predetermined flowing amount, operation of the source heating unit 123A may be stopped in order to adjust a vaporization or sublimation rate of the deposition material.

According to one embodiment, at least one of the first valve 125A, the second valve 125B, the first deposition source unit 120A, and the second deposition source unit 120B may be controlled based on the flowing amount of deposition material measured by the sensing unit 180. Methods of controlling the first valve 125A, the second valve 125B, the first deposition source unit 120A, and the second deposition source unit 120B based on the flowing amount of deposition material measured by the sensing unit 180 may be, for example, the same or substantially the same as the method described above.

The predetermined flowing amount of deposition material described above may vary, for example, based on the thickness of a deposition layer deposited on the display substrate D.

Thus, when at least one of the first valve 125A, the second valve 125B, the first deposition source unit 120A, and the second deposition source unit 120B is controlled in real time by measuring an amount of deposition material flowing through at least one of the first connection pipe 124A and the second connection pipe 124B, the deposition material may be deposited on the display substrate D to form a deposition layer having a predetermined thickness (e.g., a thickness desired by a user), using the apparatus 100 for manufacturing a display apparatus and the method of manufacturing the display apparatus.

Locations of the nozzle head 140 and the substrate mounting unit 151 may be changed, for example, based on a result measured by the distance measuring unit 191. In one embodiment, multiple distance measuring units 191 may be arranged at an edge portion of the nozzle head 140 and spaced apart from one another. For example, the distance measuring unit 191 may measure the distance between each area of the nozzle head 140 and the substrate mounting unit 151 or a distance between each area of the nozzle head 140 and the display substrate D.

In one embodiment, multiple distance measuring units 191 may be arranged apart from one another to measure the distance between each area of the nozzle head 140 and the substrate mounting unit 151 or the distance between each area of the nozzle head 140 and the display substrate D. When the distance measured by one or more of the distance measuring units 191 is different from a predetermined distance, at least one of the head operating unit 143B and the mounting plate driving unit 151C may operate.

When the distance measured by one or more of the distance measuring units 191 is less than the predetermined distance, at least one of the head operating unit 143B and the mounting plate driving unit 151C may allow at least one of the nozzle head body unit 143 and the mounting plate 151A to perform a roll motion or a pitch motion to increase the distance between a bottom surface of the nozzle head 140 and the display substrate D. In this case, the nozzle head body unit 143 may rotate in various directions based on a portion thereof connected to the supply pipe 142. Also, the mounting plate 151A may rotate in various directions based on a portion thereof connected to the connection unit 151B.

When the distance measured by one or more of the distance measuring units 191 is greater than the predetermined distance, at least one of the head operating unit 143B and the mounting plate driving unit 151C may allow at least one of the nozzle head body unit 143 and the mounting plate 151A to perform a roll motion or a pitch motion to decrease the distance between the bottom surface of the nozzle head 140 and the display substrate D. Movements of the nozzle head body unit 143 and the mounting plate 151A may be performed in a method similar to the method described above. Thus, when at least one of the head operating unit 143 and the mounting plate driving unit 151C operates, the bottom surface of the nozzle head body unit 143 and the upper surface of the display substrate D may become parallel to each other.

In addition, when the distance between the nozzle head 140 and the display substrate D, which is measured by at least one of the distance measuring units 191, or the distance between the nozzle head 140 and the substrate mounting unit 151, which is measured by at least one of the distance measuring units 191, is different from the predetermined distance, the linear driving unit 160 may operate to adjust the distance between the nozzle head 140 and the display substrate D or the distance between the nozzle head 140 and the substrate mounting unit 151 to be the same as the predetermined distance.

While the above processes are performed, the deposition preventing unit 171 may be heated to have a temperature within a predetermined range of temperatures. The covering unit 172 may be heated due to a rise in temperature of the deposition preventing unit 171, or may be heated when additional power or heat is applied thereto. When the temperature of the deposition preventing unit 171 increases, the deposition material may not be deposited on the deposition preventing unit 171. For example, in the case of the apparatus 100 for manufacturing a display apparatus, the deposition material may be physically deposited on the display substrate D without additional energy applied thereto. Thus, by increasing the temperature of the deposition preventing unit 171 to a level higher than a temperature of the deposition material, the deposition material may not be deposited on the deposition preventing unit 171.

In one embodiment, the temperature of the mounting plate 151A may be adjusted to be uniform. For example, the temperature of the mounting plate 151A may be adjusted via the temperature adjusting unit 153 such that the temperature of the mounting plate 151A is within a predetermined range of temperatures. A sensor may be in the mounting plate 151A to measure the temperature of the mounting plate 151A. In one embodiment, multiple sensors may be arranged in a plurality of areas of the mounting plate 151A and spaced apart from one another. In this case, the temperature of each area of the mounting plate 151A may be adjusted, via the temperature adjusting unit 153 in each area of the mounting plate 151, based on the temperature of each area of the mounting plate 151A as measured by each sensor. For example, each temperature adjusting unit 153 may make the temperature of the entire surface of the mounting plate 151A uniform.

When the temperature of the mounting plate 151A is uniform, the temperature of the display substrate D becomes uniform throughout the display substrate D. Thus, the thickness of the deposition material deposited on the display substrate D may become uniform. Differences in deposition of the deposition material on the display substrate D due to a thermal gradient may therefore be prevented.

The temperature adjusting unit 153 may adjust the temperatures of the plurality of areas of the mounting plate 151A to be different from one another. In this case, the temperature adjusting unit 153 may differently adjust the temperatures of the areas of the mounting plate 151A such that each temperature corresponds to a predetermined value, based on a value measured by the substrate-state sensing unit 198. In this case, it is possible to uniformly determine the amount of the deposition material deposited on the display substrate D, via adjustment of the temperature adjusting unit 153.

When the deposition of the deposition material on the display substrate D is completed, the deposition source unit 120 may stop operating. Also, after the pressure of the chamber 110 is restored to atmospheric pressure, the display substrate D may be discharged to outside of the chamber 110. In this case, the second gate valve 113D may be opened and the shutter S may be arranged at the bottom surface of the nozzle head 140 to block the deposition material dropped or sprayed from the nozzle head 140.

Accordingly, according to the apparatus 100 for manufacturing a display apparatus and the method of manufacturing the display apparatus, deposition material is deposited on the display substrate D via surface deposition. Thus, rapid deposition is possible. Also, according to the apparatus 100 for manufacturing a display apparatus and the method of manufacturing the display apparatus, deposition material is supplied uniformly to the display substrate D. Thus, a high-quality display apparatus may be manufactured.

According to the apparatus 100 for manufacturing a display apparatus and the method of manufacturing the display apparatus, the rate of deposition of deposition material deposited on the display substrate D may be adjusted, and the thickness of the deposition material on the display substrate D may be adjusted. Also, according to the apparatus 100 for manufacturing a display apparatus and the method of manufacturing the display apparatus, it is possible to adjust deposition performance, such as a rate of deposition, a thickness of deposition, etc., and thus, various display apparatuses may be manufactured.

Figure 3:
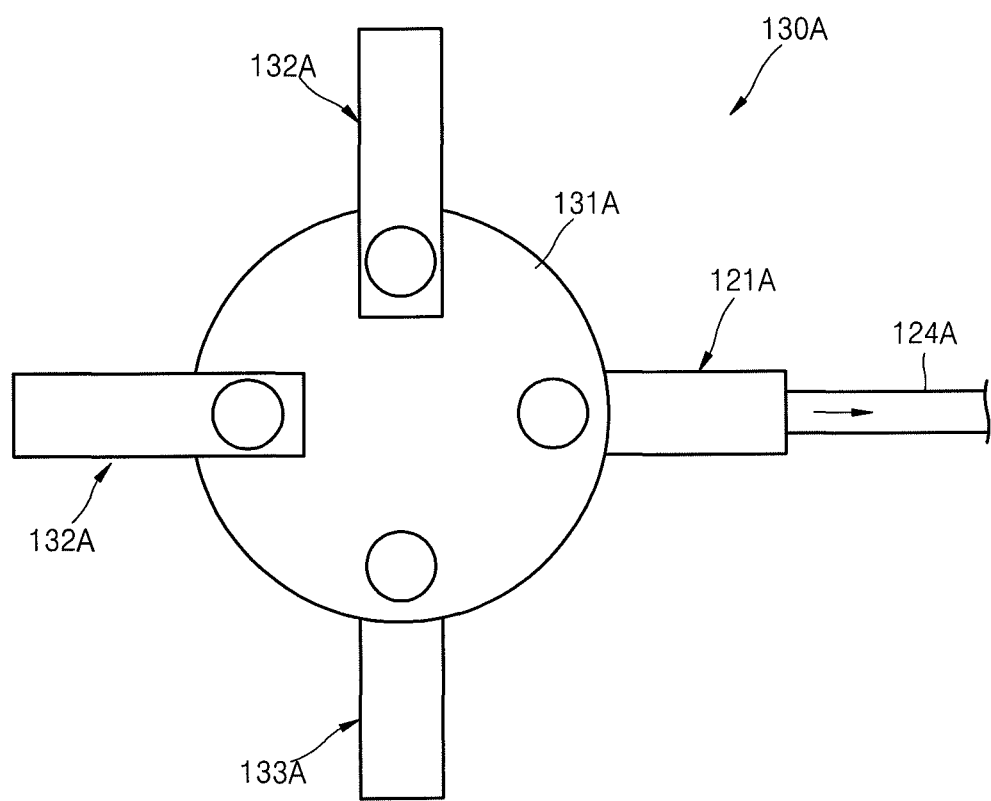
FIG. 3 illustrates an embodiment of a first material supply unit.

FIG. 3 illustrates an embodiment of the first material supply unit 130A of FIG. 1. Referring to FIG. 3, the first material supply unit 130A may replace the crucible 122A in the deposition source chamber 121A.

The first material supply unit 130A may be formed in various forms. According to an embodiment, the first material supply unit 130A may include a material supply device, a cooler, and a robot arm. In this case, the robot arm may withdraw a crucible from the deposition source chamber 121A and provide the crucible to the material supply device or the cooler. Also, the robot arm may withdraw the crucible from the material supply device or the cooler and provide the crucible to the deposition source chamber 121A.

According to one embodiment, the first material supply unit 130A may include a rotation unit 131A, a material supply device 132A, and a cooler 133A. The rotation unit 131A may rotate based on a rotational center. A robot arm, etc., may be in the rotation unit 131A to hold the crucible. In one embodiment, multiple robot arms may be in the rotation unit 131A and operate separately. The material supply device 132A may supply the deposition material to the crucible that moves according to the rotation of the rotation unit 131A. The material supply device 132A may be the same or substantially the same as a second material supply device 130B to be described below. The cooler 133A may cool the crucible and, for example, may operate according to a general cooling cycle. According to one embodiment, the cooler 133A may include a Peltier device or another device to cool the crucible.

The first material supply unit 130A may supply deposition material to a first deposition source unit. For example, the crucible may be withdrawn from the deposition source chamber 121A and may sequentially run through the cooler 133A, the material supply device 132A, and the deposition source chamber 121A, according to the rotation of the rotation unit 131A. For example, the robot arm in the rotation unit 131A may withdraw the crucible in the deposition source chamber 121A from the deposition source chamber 121A.

When the rotation unit 131A rotates, the crucible may be provided to the cooler 133A again. In this case, the cooler 133A may cool the crucible. Thereafter, when the rotation unit 131A rotates, the crucible withdrawn from the cooler 133A may be provided to the material supply device 132A. The material supply device 132A may supply a fixed quantity of deposition material to the crucible. In this case, the material supply device 132A may include a sensor for measuring a weight of the crucible.

According to one embodiment, the crucible may include a sensor for sensing the weight thereof. By comparing a value measured by the sensor with a predetermined value, the material supply device 132A may provide a fixed quantity of a deposition material to the crucible. Also, the crucible may be re-introduced to the deposition source chamber 121A according to the rotation of the rotation 131A. Thus, when the crucible is first arranged in the cooler 133A, the crucible is delivered to the material supply device 132A in a cooled state. As a result, although the deposition material is supplied to the crucible from the material supply device 132A, vaporization or sublimation of the deposition material may be reduced or minimized.

According to another embodiment, when the rotation unit 131A rotates, the crucible may be withdrawn from the deposition source chamber 121A and may sequentially run through the material supply device 132A, the cooler 133A, and the deposition source chamber 121A. Operations of the material supply device 132A and the cooler 133A may be the same or substantially the same as the operations described above.

Figure 4:
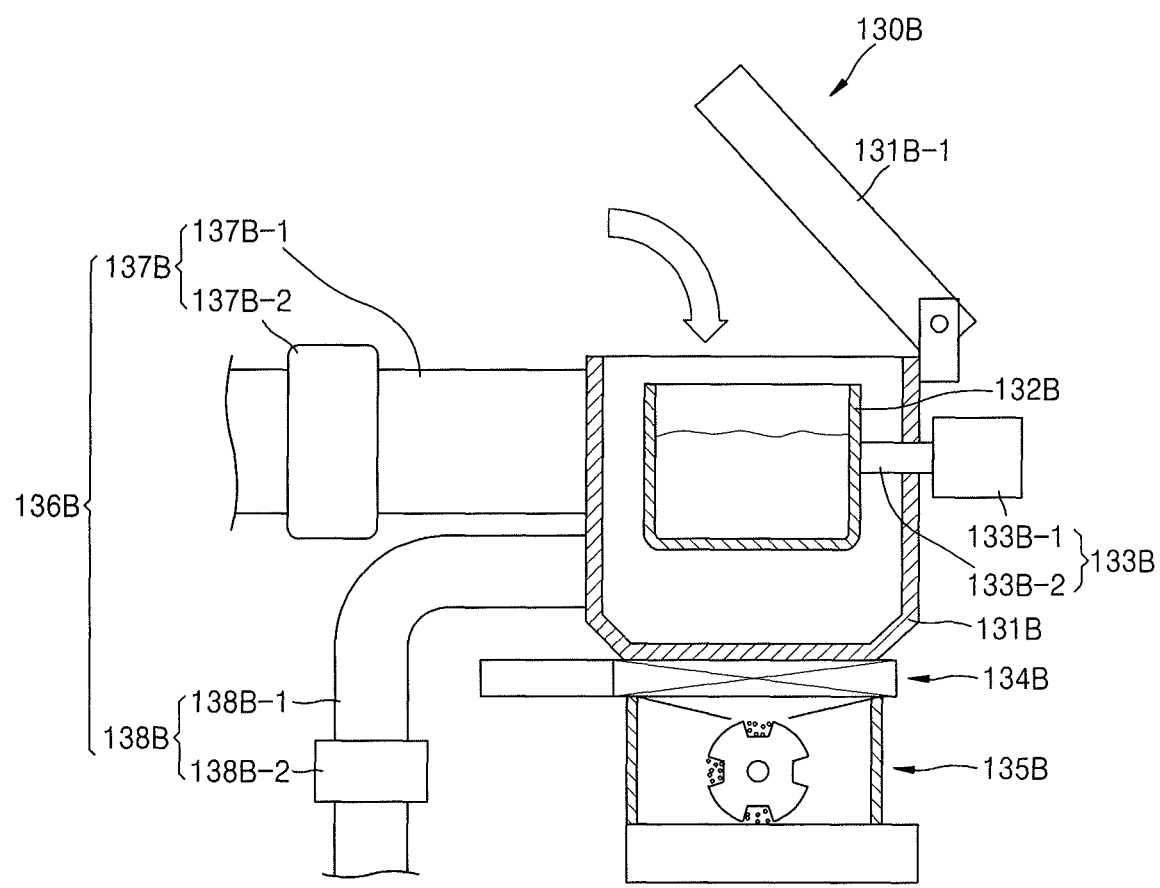
FIG. 4 illustrates an embodiment of a second material supply unit.

FIG. 4 illustrates an embodiment of the second material supply unit 130B of FIG. 1. Referring to FIG. 4, the second material supply unit 130B may include a storage chamber 131B, a deposition material storage unit 132B, a fixed-quantity-material supply unit 133B, a supply valve 134B, a particulate material supply unit 135B, and a pressure adjusting unit 136B.

The storage chamber 131B may include a space and may be formed to have a portion that is opened. The opened portion of the storage chamber 131B may include a storage chamber cover 131B-1 that slides or rotates to open and close the opened portion of the storage chamber 131B. According to one embodiment, the opened portion of the storage chamber 131B may include an additional gate valve to open and close the opened portion of the storage chamber 131B.

The deposition material storage unit 132B may be in the storage chamber 131B. The deposition material storage unit 132B may in the form of a container and may have an opened portion, such that deposition material may flow into the opened portion and may be stored in the deposition material storage unit 132B. The deposition material storage unit 132B may also include a weight sensor for measuring a weight of the deposition material.

The fixed-quantity-material supply unit 133B may be connected to the deposition material storage unit 132B and may rotate the deposition material storage unit 132B. The fixed-quantity-material supply unit 133B may have various forms. For example, the fixed-quantity-material supply unit 133B may include a motor 133B-1 connected to the deposition material storage unit 132B, and a rotation shaft 133B-2 that penetrates into the storage chamber 131B and connects the motor 133B-1 with the deposition material storage unit 132B.

According to one embodiment, the fixed-quantity-material supply unit 133B may include a rotation shaft connected to the deposition material storage unit 132B and formed so as to penetrate through the storage chamber 131B, a cam, or a link connected to the rotation shaft, and a cylinder connected to the cam or the link. In this case, the rotation shaft may be connected to a rotational center of the cam and the cylinder may be connected to a portion of the cam that is eccentric from the rotational center of the cam. Also, the rotation shaft may be connected to an end of the link and the cylinder may be connected to another end of the link. In another embodiment, the fixed-quantity-material supply unit 133B may include another device or structure that may be connected to and rotate the deposition material storage unit 132B.

The supply valve 134B may be between the storage chamber 131B and the particulate material supply unit 135B. The supply valve 134B may be, for example, a gate valve or a solenoid valve and may selectively block the particulate material supply unit 135B from the storage chamber 131B or connect the storage chamber 131B with the particulate material supply unit 135B.

The particulate material supply unit 135B may supply deposition material from the deposition material storage unit 132B to the fixed-quantity-material supply unit 121B. The particulate material supply unit 135B may supply a fixed quantity of the deposition material to the fixed-quantity-material supply unit 121B. The particulate material supply unit 135B may include, for example, a screw. When the screw rotates, a small fixed quantity of the deposition material may be supplied to the fixed-quantity-material supply unit 121B.

According to one embodiment, the particulate material supply unit 135B may include a disc having at least one groove. When the disc rotates, deposition material may be inserted into the at least one groove. Also, when the disc rotates, deposition material may be supplied to the fixed-quantity-material supply unit 121B. A different type of particulate material supply unit 135B may be included in another embodiment for supplying a small fixed quantity of the deposition material to the fixed-quantity-material supply unit 121B.

The pressure adjusting unit 136B may be connected to the storage chamber 131B and may adjust a pressure in the storage chamber 131B. For example, the pressure adjusting unit 136B may include a first pressure adjusting unit 137B and a second pressure adjusting unit 138B connected to the storage chamber 131B. The first pressure adjusting unit 137B may perform high vacuum pumping, and the second pressure adjusting unit 138B may perform low vacuum pumping. The first pressure adjusting unit 137B may include a first guide pipe 137B-1 connected to the storage chamber 131B and a first pressure pump 137B-2 in the first guide pipe 137B-1. The second pressure adjusting unit 138B may include a second guide pipe 138B-1 connected to the storage chamber 131B and a second pressure pump 138B-2 in the second guide pipe 138B-1.

The second material supply unit 130B may continually supply the deposition material to a second deposition source unit. The pressure adjusting unit 136B may operate to adjust a pressure in the storage chamber 131B to be the same or substantially the same as atmospheric pressure, and then the storage chamber 131B may be opened. Thereafter, deposition material from the outside may be supplied to the deposition material storage unit 132B. Also, the storage chamber 131B may be sealed, and the pressure adjusting unit 136B may operate to maintain the pressure in the storage chamber 131B in a vacuum state.

For example, as a first step, gas inside the storage chamber 131B may be discharged to the outside via the second pressure adjusting unit 138B. As a second step, after a predetermined period of time has passed or when the pressure inside the storage chamber 131B becomes equal to or less than a predetermined pressure, the gas inside the storage chamber 131B may be discharged to the outside via the first pressure adjusting unit 137B. When the pressure in the storage chamber 131B becomes similar to that of (e.g. to within a predetermined range) the vacuum state, the supply valve 134B may be opened and the fixed-quantity-material supply unit 133B may operate to rotate the deposition material storage unit 132B. The deposition material may drop from the deposition material storage unit 132B to the particulate material supply unit 135B.

The particulate material supply unit 135B may supply a fixed quantity of deposition material to the fixed-quantity-material supply unit 121B. For example, the particulate material supply unit 135B may prevent deposition material from rapidly dropped to the fixed-quantity-material supply unit 121B. While deposition material is supplied to the fixed-quantity-material supply unit 121B as described above, the supply valve 134B may be closed and the pressure adjusting unit 136B may operate in a manner opposite to the manner described above, in order to adjust the pressure in the storage chamber 131B to be the same or substantially the same as atmospheric pressure. Also, deposition material from the outside may be supplied to the deposition material storage unit 132B.

Figure 5:
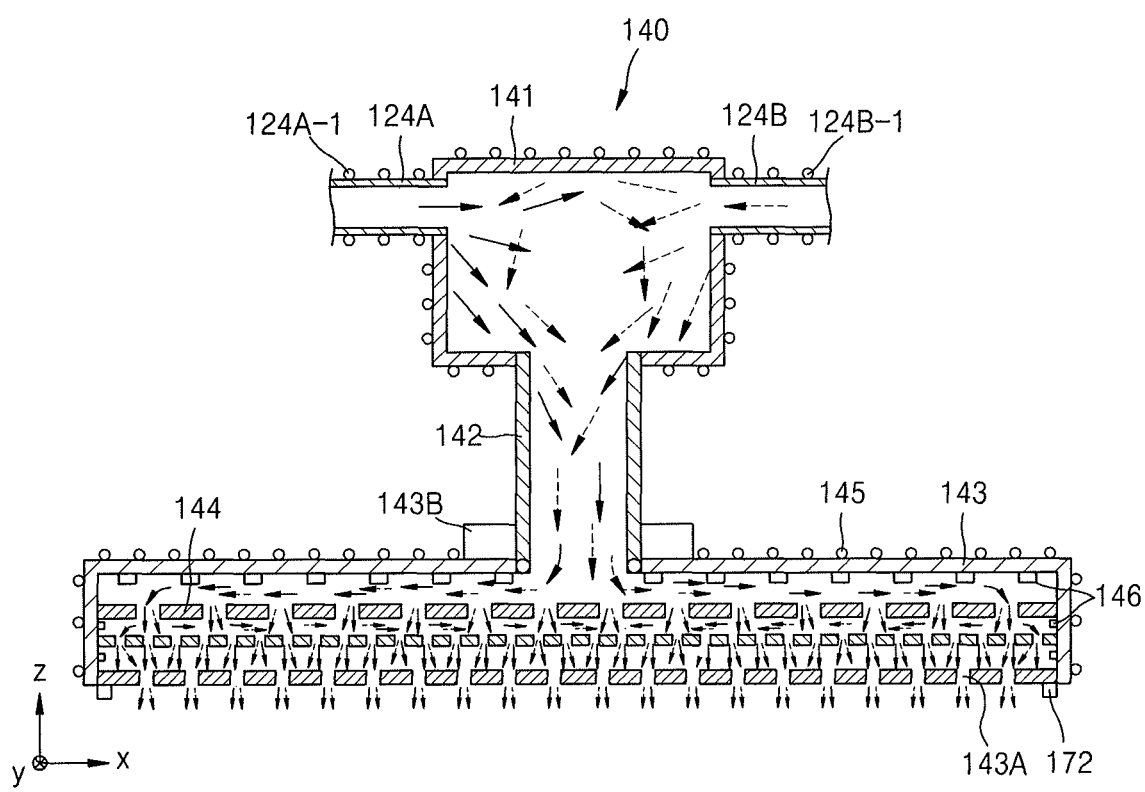
FIG. 5 illustrates an embodiment of a nozzle head.

FIG. 5 illustrates an embodiment of the nozzle head 140 of FIG. 1. Referring to FIG. 5, the nozzle head 140 may spray deposition material supplied from a deposition source unit onto a display substrate, by dispersing the deposition material. The nozzle head 140 may include various structures for dispersing or scattering the deposition material supplied from the deposition source unit. For example, the nozzle head 140 may include a plurality of pipes for guiding the deposition material to disperse the deposition material. According to one embodiment, the nozzle head 140 may use at least one baffle unit 144 to distribute the deposition material. In another embodiment, the nozzle head 140 may be a different device for dispersing deposition material supplied from the deposition source unit and for spraying the distributed deposition material onto the display substrate D.

The nozzle head 140 may include the mixing unit 141, the supply pipe 142, the nozzle head body unit 143, the baffle unit 144, and a head heater 145. The mixing unit 141 may be connected to the first connection pipe 124A and the second connection pipe 124B, and may mix the deposition material supplied from the first connection pipe 124A with deposition material supplied from the second connection pipe 124B. An area of the mixing unit 141 may be greater than an area of the first connection pipe 124A and an area of the second connection pipe 124B. Thus, the deposition material may be discharged from the first connection pipe 124A or the second connection pipe 124B at a decreased speed, and thus may have a uniform concentration in the mixing unit 141. Also, after the mixing unit 141 is completely filled with the deposition material, the deposition material may move to the nozzle head body unit 143 such that a uniform pressure is maintained in the entirety of the nozzle head body unit 143.

The supply pipe 142 may connect the nozzle head body unit 143 with the mixing unit 141. The nozzle head body unit 143 may be connected to the supply pipe 142.

The nozzle head body unit 143 may simultaneously supply the deposition material to the display substrate D in various directions. For example, the nozzle head body unit 143 may supply the deposition material to the display substrate D in a first direction and a second direction different from the first direction. For example, the nozzle head body unit 143 may simultaneously supply the deposition material to the entire area of the display substrate D, where the area is perpendicular to a height direction of the chamber 110.

A space may be formed in the nozzle head body unit 143, and the discharge hole 143A through which the deposition material passes may be provided at a surface of the nozzle head body unit 143. The surface may face the substrate fixing unit 150. In one embodiment, multiple discharge holes 143A may be uniformly distributed at the surface of the nozzle head body unit 143. The discharge holes 143A may have a plurality of rows and a plurality of columns. The nozzle head body unit 143 and the supply pipe 142 may be connected to each other and may move relative to each other. The head operating unit 143B may be additionally arranged between the nozzle head body unit 143 and the supply pipe 142, to move the nozzle head body unit 143 in various directions.

In one embodiment, the head operating unit 143B may adjust the degree of parallelization of the nozzle head body unit 143. The head operating unit 143B may include at least one motor. According to one embodiment, the head operating unit 143B may include at least two cylinders between the nozzle head body unit 143 and the chamber 110. The at least two cylinders may be at different locations from each other. The nozzle head body unit 143 and the supply pipe 142 may be connected to each other, for example, by a ball-bearing, and the supply pipe 142 may be in the ball-bearing.

The nozzle head body unit 143 may include divided areas, and the supply pipe 142 and the divided areas of the nozzle head body unit 143 may be connected to each other. Deposition material may be supplied to the divided areas of the nozzle head body unit 143. Thus, the speed at which deposition material is sprayed via the discharge hole 143A may be increased. Also, sensors may be in the divided areas of the nozzle head body unit 143 to measure at least one of a pressure, a concentration, and a flowing amount of deposition material in the divided areas. Furthermore, a valve, etc., may be provided in portions at which the supply pipe 142 and the divided areas of the nozzle head body unit 143 are connected to each other, in order to generate a difference between a pressure at which the deposition material is sprayed from a center of the nozzle head body unit 143 and a pressure at which the deposition material is sprayed from an edge of the nozzle head body unit 143.

The baffle unit 144 may be in the nozzle head body unit 143 to allow deposition material introduced to the nozzle head body unit 143 to be uniformly spread on the entire surface of the nozzle head body unit 143. In one embodiment, multiple baffle units 144 may be arranged to have step differences. Also, each baffle unit 144 may include a hole through which deposition material penetrates. Sizes of the holes may decrease, for example, in a direction from the supply pipe 142 to a surface of the nozzle head body unit 143. Also, the holes in adjacent baffle units 144 may not to overlap each other.

The head heater 145 may be outside or inside the nozzle head body unit 143. The head heater 145 may be mounted on at least a portion of the nozzle head body unit 143. In one embodiment, multiple head heaters 145 may be in the nozzle head body unit 143. The head heaters 145 may be arranged in various forms. For example, each of the areas of the nozzle head body unit 143 may include one of the head heaters 145. The head heaters 145 may separately operate to differently adjust the temperature of each of the areas of the nozzle head body unit 143.

According to one embodiment, one of the head heaters 145 may be arranged throughout the nozzle head body unit 143. Remaining head heaters 145 may be arranged in the different areas of the nozzle head body unit 143. Each area of the nozzle head body unit 143 may include one head heater 145 or a plurality of head heaters 145. Thus, the temperature of each area of the nozzle head body unit 143 may be adjusted.

According to one embodiment, one of the head heaters 145 may be arranged throughout the nozzle head body unit 143. Remaining head heaters 145 may be arranged in the different areas of the nozzle head body unit 143, respectively. For example, two head heaters 145 may be in each area of the nozzle head body unit 143, and one of the two head heaters 145 may operate to adjust the temperature of each area of the nozzle head body unit 143. The arrangement of the head heaters 145 may be different in another embodiment.

Since the nozzle head 140 may be separated from the deposition source unit 120 as described above, the nozzle head 140 may deposit the deposition material at a high speed. For example, rapid vaporization may be performed by the deposition source unit 120 to improve the deposition speed of the deposition material. Also, the deposition material may be simultaneously deposited on the entire surface of the display substrate D via nozzle head 140. Thus, rapid deposition may be performed.

The nozzle head 140 may include a nozzle sensing unit 146 in the nozzle head body unit 143. The nozzle sensing unit 146 may measure at least one of a flowing amount, a pressure, and a concentration of the deposition material in the nozzle head body unit 143. The structure of the nozzle sensing unit 146 may be the same or substantially the same as the structure of the sensing unit described above.

The temperature of the nozzle head 140 may be adjusted to be within a predetermined range of temperatures. The head heater 145 may heat the nozzle head 140 such that the temperature of the nozzle head 140 is within the predetermined range of temperatures. In one embodiment, a plurality of head heaters 145 may be in the nozzle head 140, spaced apart from one another, and separately operate to maintain temperatures of the surfaces of the nozzle head 140 within a predetermined range of temperatures.

The head heaters 145 may maintain the temperature of the nozzle head 140 to be uniform. The head heaters 145 may provide the same or different amounts of heat to each area of the nozzle head 140, for example, based on a characteristic of each area.

When the temperature of the nozzle head 140 is uniform as described above, flow of deposition material from the nozzle head 140 may be uniform. The entire nozzle head 140 may have the same or substantially the same flowing amount. When the temperature of the nozzle head 140 is uniform, the flow of deposition material in the nozzle head 140 may be stabilized.

The temperature of the nozzle head 140 may be adjusted based on a flowing amount of the deposition material measured by the nozzle sensing unit 146. For example, when the flowing amount of deposition material measured by one of the nozzle sensing units 146 is different from the flowing amount of deposition material measured by another one of the nozzle sensing units 146, or when the flowing amount of deposition material measured by one of the nozzle sensing units 146 is different from a predetermined flowing amount of deposition material, the temperature of the nozzle head 140 may be adjusted by controlling one of the head heaters 145 arranged in a corresponding area. The relationship between the temperature of the nozzle head 140 and the flowing amount of deposition material may be, for example, pre-set in the form of a table.

The head heaters 145 may be controlled based on the thickness of deposition material on a display substrate. The thickness may be measured, for example, by a substrate-state sensing unit. In one embodiment, the thickness of deposition material on the display substrate may be compared with a predetermined thickness. Each head heater 145 may be operated based on the comparison. In one embodiment, the head heaters 145 may be differently controlled based on the thickness of the deposition material on the display substrate.

Figure 6:
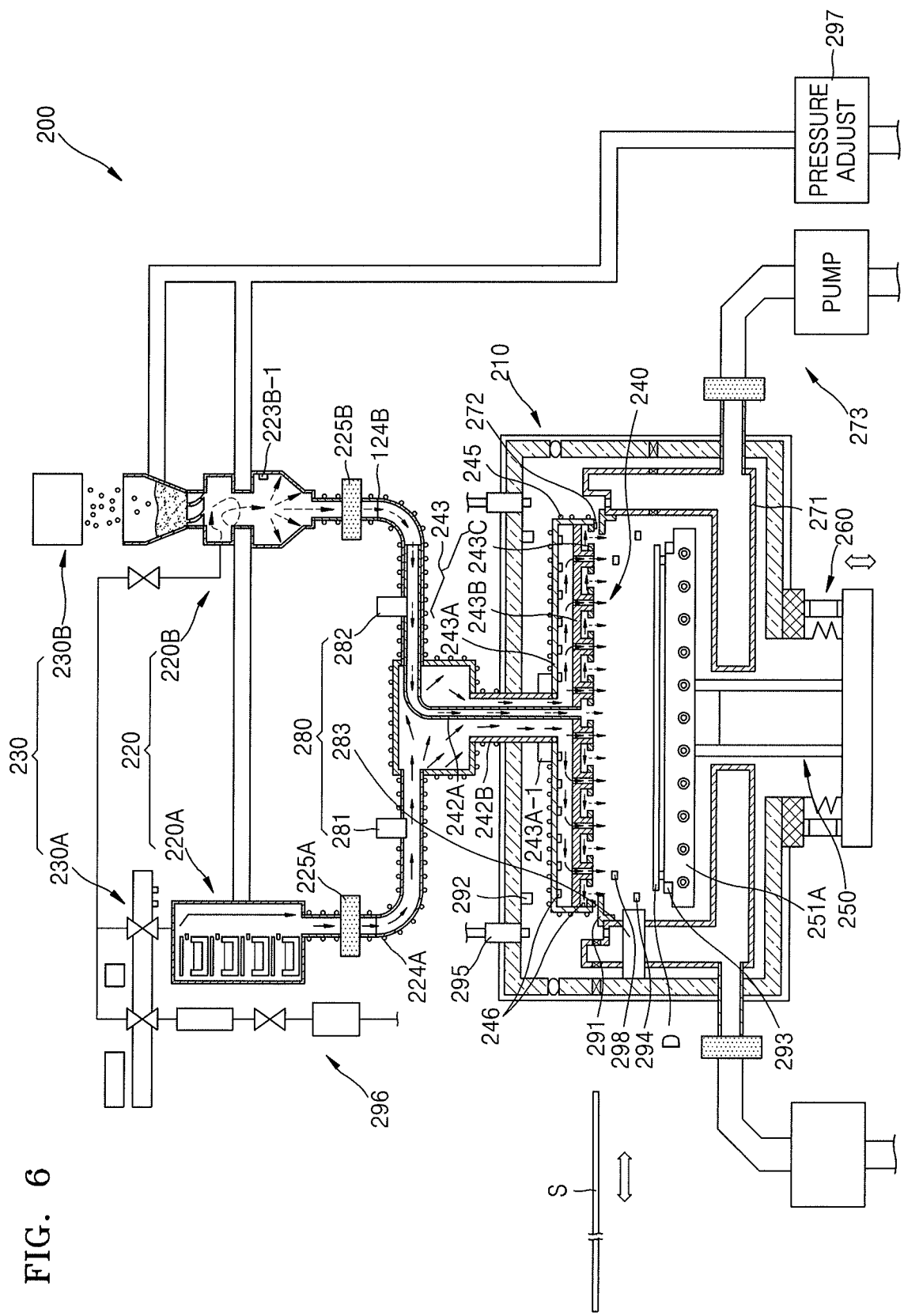
FIG. 6 illustrates another embodiment of an apparatus for manufacturing a display apparatus.

FIG. 6 illustrates another embodiment of an apparatus 200 for manufacturing a display apparatus which may include a chamber 210, a deposition source unit 220, a material supply unit 230, a nozzle head 240, a substrate fixing unit 250, a linear driving unit 260, a deposition preventing unit 271, a covering unit 272, a chamber pressure adjusting unit 273, a blocking gas supply unit 295, a sensing unit 280, a distance measuring unit 291, a vision unit 292, an alignment unit 293, a mask mounting unit 294, a blocking gas supply unit 295, a carrier gas supply unit 296, and a deposition source pressure adjusting unit 297.

The chamber 210, the deposition source unit 220, the material supply unit 230, the substrate fixing unit 250, the linear driving unit 260, the deposition preventing unit 271, the covering unit 272, the chamber pressure adjusting unit 273, the blocking gas supply unit 295, the sensing unit 280, the distance measuring unit 291, the vision unit 292, the alignment unit 293, the mask mounting unit 294, the blocking gas supply unit 295, the carrier gas supply unit 296, and the deposition source pressure adjusting unit 297 may be the same or substantially the same as corresponding components in other embodiments described herein.

The apparatus 200 for manufacturing a display apparatus may operate in a manner which is the same or substantially the same as the manner in which the apparatus 100 for manufacturing a display apparatus operates. The apparatus 200 for manufacturing a display apparatus may insert a display substrate D into the chamber 210 and may deposit deposition material on the display substrate D. Each of a first deposition source unit 220A and a second deposition source unit 220B may vaporize or sublimate the deposition material and may supply the vaporized or sublimated deposition material to the nozzle head 240.

The deposition material supplied from the deposition source unit 220A to the nozzle head 240, and the deposition material supplied from the deposition source unit 220B to the nozzle head 240, may include different materials. Also, the first deposition source unit 220A and the second deposition source unit 220B may simultaneously operate or sequentially operate.

The deposition material supplied from the first deposition source unit 220A and the deposition material supplied from the second deposition source unit 220B may be supplied to the nozzle head 240 via different flow paths. The nozzle head 240 has a divided internal structure. Thus, deposition material supplied from the first deposition source unit 220A and the deposition material supplied from the second deposition source unit 220B may be discharged from the nozzle head 240 and mixed in the chamber 210.

The mixed deposition material may be deposited on the display substrate D. In this case, the apparatus 200 for manufacturing a display apparatus may adjust a mixing ratio (or doping ratio) of deposition material on the display substrate D. For example, the deposition speed of deposition material may vary based on an amount of the deposition material supplied from the deposition source unit 220. For example, when the amount of deposition material supplied from the deposition source unit 220 increases, a relative deposition speed of another deposition material may increase. When the amount of deposition material supplied from the deposition source unit 220 decreases, a relative deposition speed of another deposition material may decrease. The mixing ratio of the deposition materials may be adjusted based on this difference in the deposition speeds.

In order to adjust the mixing ratio of the deposition materials, a first valve 225A may adjust the degree of opening of a first connection pipe 224A based on a result sensed by a first sensing unit 281. The adjusted degree of opening of the first valve 225A adjusts the amount of deposition material supplied from the first deposition source unit 220A. A second valve 225B may adjust the degree of opening of the second connection pipe 224B based on a result sensed by a second sensing unit 282. The adjusted degree of opening of the second valve 225B adjusts the amount of deposition material supplied from the second deposition source unit 220B.

In one embodiment, a user may adjust the flowing amount of deposition material from the first deposition source unit 220A and the flowing amount of deposition material from the second deposition source unit 220B, in order to adjust the mixing ratio of the deposition material on the display substrate D to a desired value in real time. For example, by adjusting the flowing amount of deposition material from the first deposition source unit 220A and the flowing amount of deposition material from the second deposition source unit 220B, the mixing ratio of the deposition materials may be adjusted for each layer when a plurality of layers are formed on the display substrate D.

The apparatus 200 for manufacturing a display apparatus may adjust the degree of parallelization between the nozzle head 240 and a mounting plate 251A. The method of adjusting the degree of parallelization may be the same or different from the method described above.

The apparatus 200 for manufacturing a display apparatus may adjust the distance between the nozzle head 240 and the mounting plate 251A, in order to adjust the thickness of deposition material on the display substrate D. The relationship between the thickness of the deposition material on the display substrate D and the distance between the nozzle head and the mounting plate 251A may be, for example, pre-set in the form of a table.

In addition, the apparatus 200 for manufacturing a display apparatus may adjust the distance between the nozzle head 240 and the mounting plate 251A to adjust one of the temperature of the display substrate D and the temperature of the mounting plate 251A, to thereby adjust the thickness of the deposition material deposited on the display substrate D. Thus, when the thickness of the deposition material desired by the user is input, the distance between the nozzle head 240 and the mounting plate 251A may be adjusted by measuring the distance between the nozzle head 240 and the mounting plate 251A.

In addition, the apparatus 200 for manufacturing a display apparatus may adjust the thickness of the deposition material via the chamber pressure adjusting unit 273. The chamber pressure adjusting unit 273 may adjust the thickness of the deposition material by adjusting an amount of intake of the deposition material. The chamber pressure adjusting unit 273 may operate based on the flowing amount (or concentration) of deposition material sensed by the third sensing unit 283. The relationship between the thickness of the deposition material and the flowing amount of deposition material may be, for example, pre-set in the form of a table.

Accordingly, according to the apparatus 200 for manufacturing a display apparatus and the method of manufacturing the display apparatus, the deposition material is deposited on the display substrate D via surface deposition. Thus, rapid deposition is possible. Also, the deposition material may be uniformly supplied to the display substrate D. Thus, a high-quality display apparatus may be manufactured. Also, the rate of deposition, thickness of deposition, etc., may be adjusted. As a result, various types of display apparatuses may be manufactured.

Figure 7:
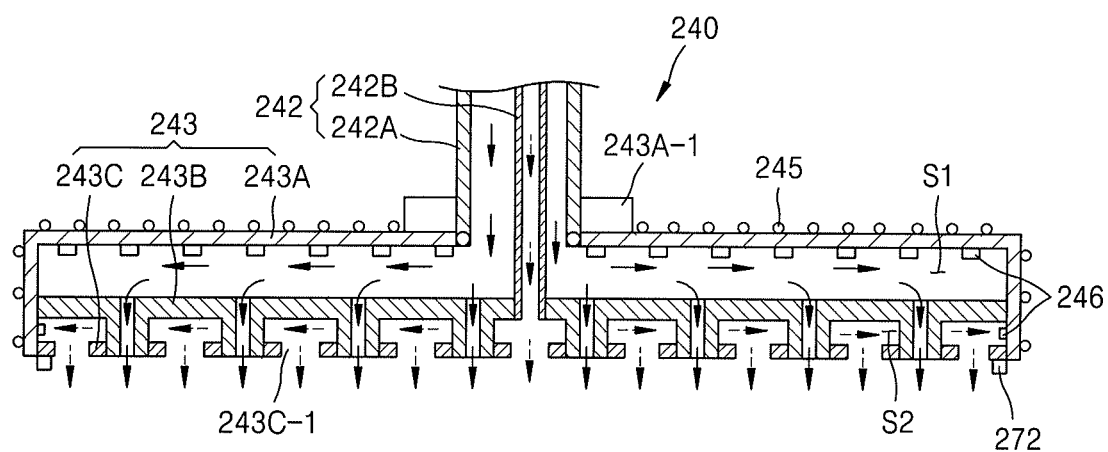
FIG. 7 illustrates another embodiment of a nozzle head.

FIG. 7 illustrates an embodiment of the nozzle head 240 of FIG. 6. Referring to FIG. 7, the nozzle head 240 may include a supply pipe 242, a nozzle head body unit 243, a head heater 245, and a nozzle sensing unit 246.

The supply pipe 242 may include a first supply pipe 242A connected to a first connection pipe 224A and a second supply pipe 242B connected to a second connection pipe 224B. The first supply pipe 242A and the second supply pipe 242B may be separately formed, and the second supply pipe 242B may be in the first supply pipe 242A.

The nozzle head body unit 243 may include a first nozzle head body unit 243A, a protrusion unit 243B, and a second nozzle head body unit 243C. The first nozzle head body unit 243A may be connected to the first supply pipe 242A. A head operating unit 243A-1 may be between the first nozzle head body unit 243A and the first supply pipe 242A and connected to the first supply pipe 242A to allow the nozzle head body unit 243A to be movable. The protrusion unit 243B may be coupled to the first nozzle head body unit 243A to form a first space S1. A hole may be formed in the protrusion unit 243B so as to be connected to the first space S1 and the chamber 210.

Also, the second nozzle head body unit 243C may be coupled to the protrusion unit 243B to form a second space S2. The first space S1 may be connected to the first supply pipe 242A and the second space S2 may be connected to the second supply pipe 242B. A portion of the protrusion unit 243B may be exposed to a lower surface of the second nozzle head body unit 243C. Also, a discharge hole 243C-1 may be included in the second nozzle head body unit 243C.

Deposition material supplied via the first supply pipe 242A may be stored in the first space S1, and then may be supplied to the display substrate D via the protrusion unit 243B. However, deposition material supplied via the second supply pipe 242B may be introduced into the second space S2, and then may be sprayed onto the display substrate D via the discharge hole 243C-1.

A single head heater 245 may be provided to heat the entire nozzle head body unit 243. According to one embodiment, multiple head heaters 245 may be provided, and some of the plurality of head heaters 245 may be in the first nozzle head body unit 243A. Other head heaters 245 may be in the second nozzle head body unit 243C.

According to one embodiment, multiple head heaters 245 may be in a plurality of divided areas of the nozzle head body unit 243 and separate from one another. According to one embodiment, one of the head heaters 245 may be arranged throughout the nozzle head body unit 243, and remaining head heaters 245 may be in the first nozzle head body unit 243A and the second nozzle head body unit 243C to operate separately. Each of the head heaters 245 may be controlled in a manner which is the same or substantially the same as the manner described above.

The nozzle sensing unit 246 may be in the first space S1 and the second space S2. The nozzle sensing unit 246 may be the same or substantially the same as described above.

The nozzle head 240 may supply deposition material to the display substrate D via different paths. In this case, different deposition materials may be simultaneously supplied to the display substrate D and deposited on the display substrate D, or may be sequentially supplied to and deposited on the display substrate D. When the different deposition materials are deposited on the display substrate D, the mixing ratio of the deposition materials may be adjusted by a user, as described above.

Thus, according to the apparatus 200 for manufacturing a display apparatus and the method of manufacturing the display apparatus, various deposition processes may be implemented via one device.

Figure 8:
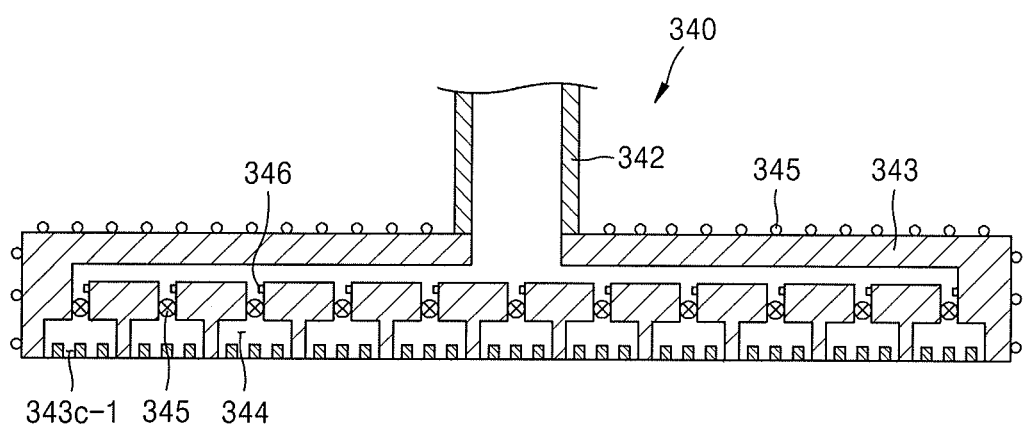
FIG. 8 illustrates another embodiment of an apparatus for manufacturing a display apparatus.

FIG. 8 illustrates another embodiment of a nozzle head 340 of an apparatus for manufacturing a display apparatus. Referring to FIG. 8, the nozzle head 340 may include a supply pipe 342, a nozzle head body unit 343 connected to the supply pipe 342, a plurality of flow channels 344 in the nozzle head body unit 343, a plurality of nozzle sensing units 346 in the flow channels 344, and a plurality of flow blocking units 345 respectively arranged in the flow channels 344.

A plurality of discharge holes 343C-1 may be in the nozzle head body unit 343. Also, the flow channels 344 may respectively be connected to some of the discharge holes 343C-1 corresponding areas and may guide a deposition material. The nozzle head body unit 343 may be divided into a plurality of areas, and the divided areas of the nozzle head body unit 343 may separately supply deposition material to a display substrate.

The nozzle sensing unit 346 may measure at least one of an amount, a concentration, and a pressure of a deposition material flowing through each of the flow channels 344. The nozzle sensing unit 346 may be the same or substantially the same as the sensing unit 180 described above.

The flow blocking units 345 may control the amount of deposition material flowing through each of the flow channels 344. The flow blocking units 345 may separately operate.

With respect to an operation of the nozzle head 340, when deposition material is supplied to the supply pipe 342, the deposition material may be supplied to the discharge holes 343C-1 via each of the flow channels 344. When the supply pipe 342 supplies the same deposition material or when the supply pipe 342 mixes different deposition materials and supplies the mixture of deposition materials, each of the flow channels 344 may be connected to the supply pipe 342.

According to one embodiment, when the supply pipe 342 supplies different deposition materials without mixing the different deposition materials, multiple supply pipes 342 may be provided so that each of the deposition materials may flow through the supply pipes 342. Also, the flow channels 344 may be connected to the supply pipes 342 such that the deposition materials may be separately sprayed.

The deposition material flowing into the supply pipe 342 may move through each flow channel 344 and may be discharged to the outside via the discharge hole 343C-1. The flow blocking unit 345 may control the deposition material flowing through each flow channel 344. A value sensed by the nozzle sensing unit 346 may be compared with a predetermined value. When the sensed value is less than the predetermined value, the flow blocking unit 345 may be controlled so as to increase the amount of deposition material flowing through each flow channel 344. However, when the sensed value is greater than the predetermined value, the flow blocking unit 345 may be controlled to decrease the amount of deposition material flowing through each flow channel 344. Thus, the nozzle head 340 may uniformly supply the deposition material to each area of the display substrate. Thus, deposition material may be uniformly deposited onto each area of the display substrate.

The flow blocking unit 345 may also be controlled based on a result of sensing performed via a substrate-state sensing unit. For example, multiple substrate-state sensing units may be provided as described above to monitor the entire display substrate. The substrate-state sensing units may monitor states of respective areas of the display substrate.

The flow blocking unit 345 may be controlled based on results of the monitoring. For example, when a value measured by each of the substrate-state sensing units is compared with a predetermined value, and the measured value is greater than the predetermined value, the amount of the deposition material supplied via the flow blocking unit 345 may be decreased. However, when the measured value is less than the predetermined value, the amount of the deposition material supplied via the flow blocking unit 345 may be increased.

The nozzle head 340 may precisely supply the deposition material to each area of the display substrate, and thus may perform uniform deposition of the deposition material onto the display substrate. In one embodiment, the nozzle head 340 may include a head operating unit, for example, as illustrated in FIGS. 5 and 7, to adjust the posture of the head body unit 343.

Figure 9:
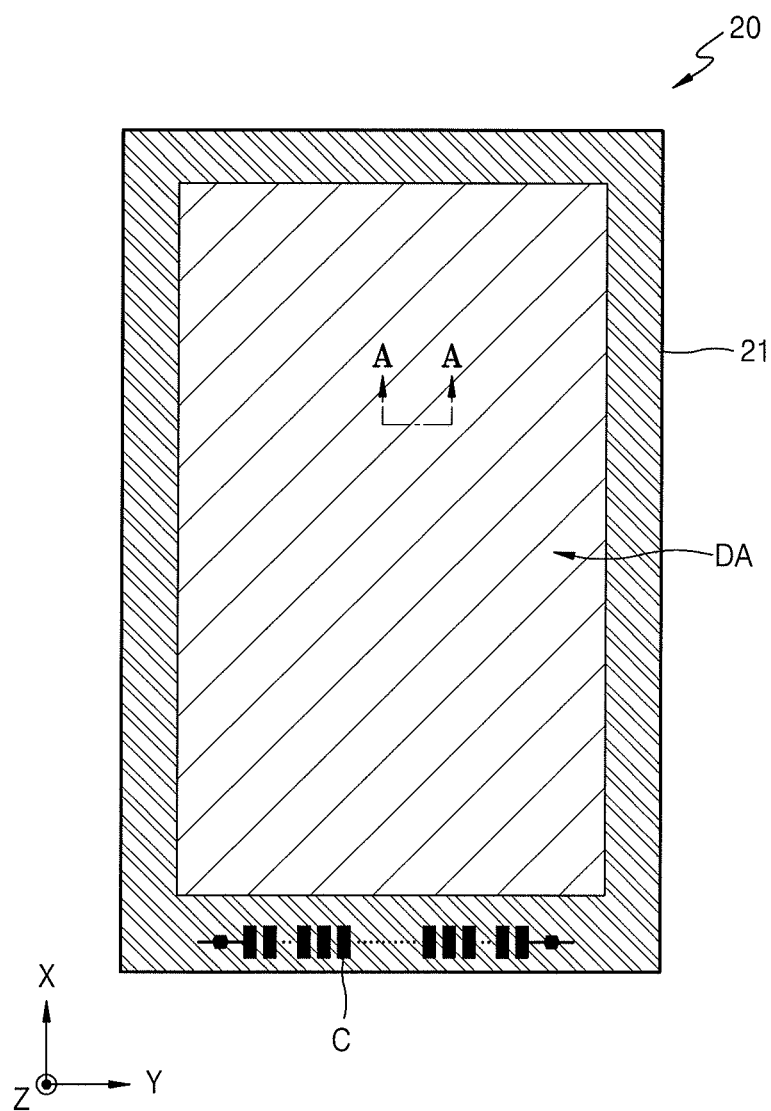
FIG. 9 illustrates an embodiment of a display apparatus.

FIG. 9 illustrates an embodiment of a display apparatus 20 manufactured by the apparatus 100 or 200 for manufacturing a display apparatus illustrated in any one of FIGS. 1, 6, and 8.

Referring to FIG. 9, the display apparatus 20 may include a substrate 21 on which a display area DA and a non-display area outside the display area DA are defined. An emission unit may be in the display area DA, and a power wire, etc., may be in the non-display area. A pad unit C may be in the non-display area.

Figure 10:
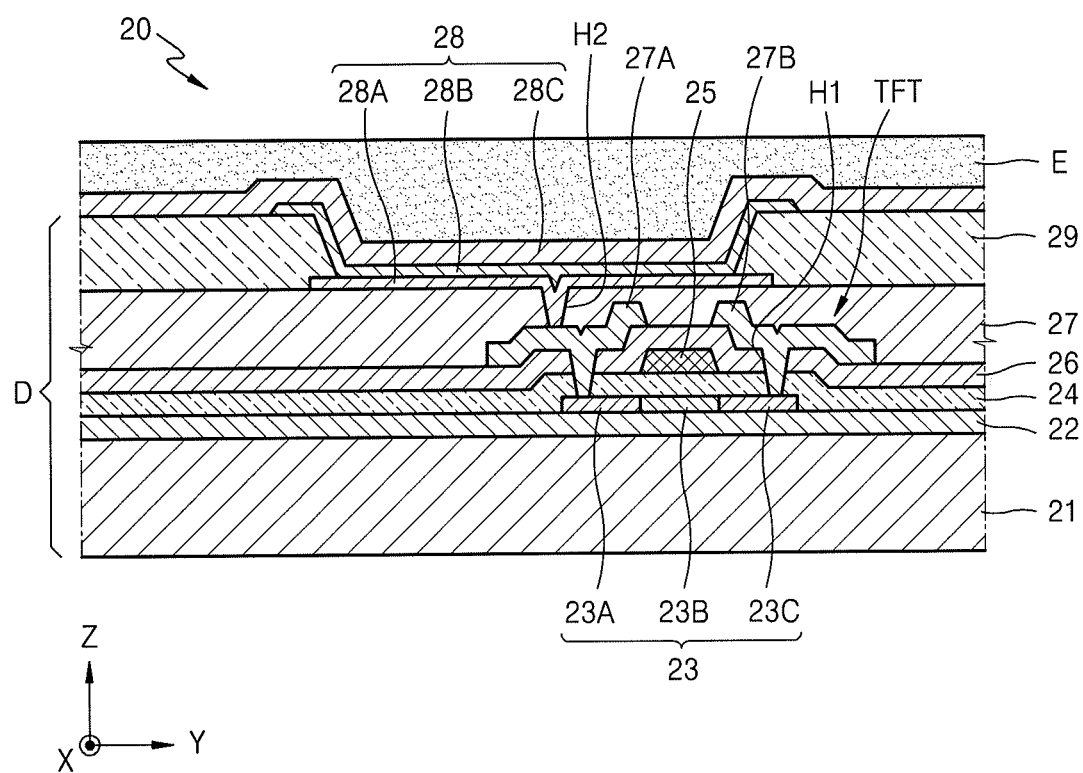
FIG. 10 illustrates an sectional embodiment taken along line A-A in FIG. 9.

FIG. 10 illustrates a cross-sectional embodiment taken along line A-A in FIG. 9. Referring to FIG. 10, the display apparatus 20 may include a display substrate D, an intermediate layer 28B, an opposite electrode 28C, and an encapsulation layer. The display substrate D may include the substrate 21, a buffer layer 22, a thin film transistor (TFT) a passivation layer 27, a pixel electrode 28A, and a pixel-defining layer 29. The encapsulation layer may include an encapsulation substrate, which is the same or substantially the same as the substrate 21, or a thin film encapsulation layer E. When the encapsulation layer includes the encapsulation substrate, a sealing member may be additionally arranged between the substrate 21 and the encapsulation substrate. The substrate 21 may include a plastic material, a polyimide (PI), or a metal material such as SUS, Ti, etc.

An emission unit may be on the substrate 21 and may include the TFT. The passivation layer 27 may cover the emission unit and the TFT. An organic light-emitting device (OLED) 28 may be on the passivation layer 27.

The buffer layer 22 including an organic compound and/or an inorganic compound may be on the substrate 21. The buffer layer 22 may include SiOx (x≥1) or SiNx (x≥1).

An active layer 23 may be on the buffer layer 22 and may have a predetermined pattern. The active layer 23 may be buried by a gate insulating layer 24. The active layer 23 may include a source area 23C and a drain area 23A, and a channel area 23B therebetween. The active layer 23 may be include various materials. For example, the active layer 23 may include an inorganic semiconductor material such as amorphous silicon or crystalline silicon. As another example, the active layer 23 may include an oxide semiconductor. As another example, the active layer 23 may include an organic semiconductor material.

The active layer 23 may be formed by forming an amorphous silicon layer on the buffer layer 22, crystallizing the amorphous silicon layer to form a polycrystalline silicon layer, and patterning the polycrystalline silicon layer. The source area 23C and the drain area 23A of the active layer 23 may be doped with impurities, based on TFTs, such as a driving TFT, a switching TFT, etc.

A gate electrode 25 corresponding to the active layer 23, and an interlayer insulating layer 26 burying the gate electrode 25, may be formed on the gate insulating layer 24.

After a contact hole H1 is formed in the interlayer insulating layer 26 and the gate insulating layer 24, a source electrode 27B and a drain electrode 27A may be formed on the interlayer insulating layer 26 to contact the source area 23C and the drain area 23A, respectively.

The passivation layer 27 may be on the TFT formed as described above. The pixel electrode 28A of the OLED 28 may be on the passivation layer 27. The pixel electrode 28A may contact the drain electrode 27A of the TFT via a via hole H2 in the passivation layer 27. The passivation layer 27 may be formed as a single layer or at least two layers including an inorganic material and/or an organic material. The passivation layer 27 may be formed as a planarization layer having a flat upper surface irrespective of curvedness of lower layers located below the passivation layer 27, while having curvedness corresponding to the curvedness of the lower layers. Also, it is desirable that the passivation layer 27 be formed as a transparent insulator, so as to achieve a resonance effect.

After the pixel electrode 28A is formed on the passivation layer 27, the pixel-defining layer 29 may be formed by using an organic material and/or an inorganic material, to cover the pixel electrode 28A and the passivation layer 27. The pixel-defining layer 29 may have an opening exposing the pixel electrode 28A. The intermediate layer 28B and the opposite electrode 28C may be formed at least on the pixel electrode 28A.

The pixel electrode 28A may serve as an anode and the opposite electrode 28C may serve as a cathode. In one embodiment, the pixel electrode 28A may serve as a cathode and the opposite electrode 28C may serve as an anode. The pixel electrode 28A and the opposite electrode 28C may be insulated from each other by the intermediate layer 28B. Voltages having different polarities may be applied to the intermediate layer 28B such that light is emitted from an organic emission layer.

The intermediate layer 28B may include the organic emission layer. In one example, the intermediate layer 28B may include the organic emission layer, and in addition to the organic emission layer may further include at least one of a hole injection layer (HIL), a hole transport layer (HTL), an electron transport layer (ETL), and an electron injection layer (EIL). The present embodiment is not limited thereto, and the intermediate layer 28B may include the organic emission layer and further include various other functional layers.

The intermediate layer 28B described above may be formed by an apparatus for manufacturing a display apparatus described above.

Each unit pixel may include a plurality of sub-pixels that emit light of different colors. For example, the sub-pixels may emit red, green, and blue light, or may emit red, green, blue, and white light.

The thin film encapsulation layer E may include a plurality of inorganic layers, or an inorganic layer and an organic layer. The organic layer of the thin film encapsulation layer E may include a polymer. The organic layer of the thin film encapsulation layer E may be a single layer or a stack of layers including, for example, one of polyethylene terephthalate, PI, polycarbonate, epoxy, polyethylene, and polyacrylate. In one embodiment, the organic layer may include polyacrylate. For example, the organic layer of the thin film encapsulation layer E may include a polymerized monomer composition including a diacrylate-based monomer and a triacrylate-based monomer. The monomer composition may include a monoacrylate-based monomer. In one embodiment, the monomer composition may further include a photoinitiator, e.g., TPO.

The inorganic layer of the thin film encapsulation layer E may be a single layer or a stack of layers including a metal oxide or a metal nitride. For example, the inorganic layer of the thin film encapsulation layer E may include one of SiNx, $Al_2O_3$, $SiO_2$, and $TiO_2$.

An uppermost layer of the thin film encapsulation layer E exposed to the outside may be an inorganic layer to prevent penetration of moisture into the OLED 28.

The thin film encapsulation layer E may include at least one sandwich structure having at least one organic layer between at least two inorganic layers. In one example, the thin film encapsulation layer E may include at least one sandwich structure having at least one inorganic layer between at least two organic layers. In one example, the thin film encapsulation layer E may include a sandwich structure having at least one organic layer between at least two inorganic layers, and a sandwich structure having at least one inorganic layer between at least two organic layers.

In one embodiment, the thin film encapsulation layer E may sequentially include a first inorganic layer, a first organic layer, and a second inorganic layer on the OLED.

In one example, the thin film encapsulation layer E may sequentially include a first inorganic layer, a first organic layer, a second inorganic layer, a second organic layer, and a third inorganic layer on the OLED.

In one example, the thin film encapsulation layer E may sequentially include a first inorganic layer, a first organic layer, a second inorganic layer, the second organic layer, a third inorganic layer, a third organic layer, and a fourth inorganic layer on the OLED.

A halogenated metal layer including LiF may further be included between the OLED and the first inorganic layer. The halogenated metal layer may prevent the OLED from being damaged when the first inorganic layer is formed by sputtering.

The first organic layer may have a smaller area than the second inorganic layer. Also, the second organic layer may have a smaller area than the third inorganic layer.

In accordance with one or more of the aforementioned embodiments, a apparatus and method may be provided which reduces the time and cost to manufacture a display apparatus. Also, the apparatus and method may adjust the deposition thickness of deposition material in real time. Also, when various deposition materials are deposited by being mixed, the apparatus and method may adjust a mixing ratio, a degree of doping, etc., of the deposition materials.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method of manufacturing a display apparatus, the method comprising:
    mounting a display substrate on a substrate mounting unit in a chamber;
    spraying and depositing a deposition material onto an entire upper surface of the display substrate from a nozzle head;
    maintaining a temperature of the display substrate to be lower than a temperature of the deposition material;
    spraying a blocking gas from a blocking gas unit: (i) to an outside of a region where the deposition material is sprayed from the nozzle head to the display substrate and (ii) to a side edge of the display substrate, the blocking gas unit being located above at least a portion of the nozzle head and the blocking gas unit facing the upper surface of the display substrate;
    measuring a distance between a surface of the nozzle head and the display substrate at a plurality of different areas on the display substrate; and
    when the measured distance differs from a predetermined distance between the surface of the nozzle head and the display substrate, operating a linear driving unit to adjust the distance between the surface of the nozzle head and the display substrate by the substrate mounting unit performing a roll motion or a pitch motion to vary the distance between one or more different areas on the display substrate and the nozzle head.

2. The method as claimed in claim 1, further comprising: adjusting a degree of parallelization of the nozzle head via which the deposition material is sprayed.

3. The method as claimed in claim 1, further comprising: adjusting a degree of parallelization of the display substrate.

4. The method as claimed in claim 1, further comprising: discharging the deposition material from the chamber to an outside of the chamber.

5. The method as claimed in claim 1, further comprising: adjusting a thickness at which the deposition material is deposited onto the display substrate.

6. The method as claimed in claim 5, wherein:
    the thickness at which the deposition material is deposited onto the display substrate is adjusted by adjusting at least one of a temperature of a substrate fixer in which the display substrate is mounted, an amount of the deposition material supplied into the chamber, and an amount of the deposition material discharged to the outside of the chamber.

7. The method as claimed in claim 1, further comprising: adjusting a temperature of the nozzle head via which the deposition material is sprayed.

8. The method as claimed in claim 1, further comprising: adjusting a temperature of a substrate fixer in which the display substrate is mounted.

9. The method as claimed in claim 1, wherein:
    the deposition material includes a plurality of different deposition materials, and
    the plurality of different deposition materials are sequentially or simultaneously deposited onto the display substrate.

10. The method as claimed in claim 1, wherein:
    the deposition material includes a plurality of different deposition materials, and
    the plurality of different deposition materials are mixed in the chamber.

11. The method as claimed in claim 1, wherein the blocking gas unit is located at a top surface of the chamber.

12. The method as claimed in claim 1, wherein the deposition material is supplied into the chamber via a carrier gas.

13. The method as claimed in claim 12, wherein a flowing amount of the deposition material is adjusted via the carrier gas.

14. A method of manufacturing a display apparatus, the method comprising:
    mounting a display substrate on a substrate mounting unit in a chamber;
    spraying and depositing a deposition material from a nozzle head onto an entire upper surface of the display substrate;
    adjusting a thickness at which the deposition material is deposited onto the display substrate by adjusting at least one of a temperature of the nozzle head spraying the deposition material, a temperature of a substrate fixer in which the display substrate is mounted, an amount of the deposition material supplied into the chamber, and an amount of the deposition material discharged to an outside of the chamber;
    spraying a blocking gas from a blocking gas unit: (i) to an outside of a region where the deposition material is sprayed from the nozzle head to the display substrate and (ii) to a side edge of the display substrate, the blocking gas unit being located above at least a portion of the nozzle head and the blocking gas unit facing the upper surface of the display substrate;
    measuring a distance between a surface of the nozzle head and the display substrate at a plurality of different areas on the display substrate; and
    when the measured distance differs from a predetermined distance between the surface of the nozzle head and the display substrate, operating a linear driving unit to adjust the distance between the surface of the nozzle head and the display substrate by the substrate mounting unit performing a roll motion or a pitch motion to vary the distance between one or more different areas on the display substrate and the nozzle head.

15. A method of manufacturing a display apparatus, the method comprising:
    mounting a display substrate on a substrate mounting unit in a chamber;
    spraying and depositing a plurality of different deposition materials onto an entire upper surface of the display substrate;
    adjusting a mixing ratio of the plurality of different deposition materials;

spraying a blocking gas from a blocking gas unit: (i) to an outside of a region where the deposition materials are sprayed from a nozzle head to the display substrate and (ii) to side edge of the display substrate, the blocking gas unit being located above at least a portion of the nozzle head and the blocking gas unit facing the upper surface of the display substrate; and measuring a distance between a surface of the nozzle head and the display substrate at a plurality of different areas on the display substrate; and when the measured distance differs from a predetermined distance between the surface of the nozzle head and the display substrate, operating a linear driving unit to adjust the distance between the surface of the nozzle head and the display substrate by the substrate mounting unit performing a roll motion or a pitch motion to vary the distance between one or more different areas on the display substrate and the nozzle head.

\* \* \* \* \*